(12) United States Patent
Lazar

(10) Patent No.: US 11,444,577 B2
(45) Date of Patent: Sep. 13, 2022

(54) BOOST AMPLIFIER

(71) Applicant: Samsung Electronics Co., Ltd., Suwon-si (KR)

(72) Inventor: James F. Lazar, Moorpark, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 208 days.

(21) Appl. No.: 16/893,838

(22) Filed: Jun. 5, 2020

(65) Prior Publication Data

US 2020/0389129 A1 Dec. 10, 2020

Related U.S. Application Data

(60) Provisional application No. 62/858,872, filed on Jun. 7, 2019.

(51) Int. Cl.
| | |
|---|---|
| *H03F 3/217* | (2006.01) |
| *H03F 1/02* | (2006.01) |
| *H02M 3/158* | (2006.01) |
| *H03F 3/183* | (2006.01) |

(52) U.S. Cl.
CPC .......... *H03F 1/0227* (2013.01); *H02M 3/158* (2013.01); *H03F 3/183* (2013.01); *H03F 3/2171* (2013.01); *H03F 2200/03* (2013.01)

(58) Field of Classification Search
CPC ...... H03F 1/0227; H03F 3/183; H03F 3/2171; H03F 2200/03; H03F 3/2173; H03F 1/0238; H03F 3/217; H03F 2200/351; H02M 3/158; H02M 7/48; H02M 1/38
USPC ............................................. 330/251, 207 A
See application file for complete search history.

(56) References Cited

U.S. PATENT DOCUMENTS

| | | |
|---|---|---|
| 4,186,437 A | 1/1980 | Cuk |
| 5,548,206 A | 8/1996 | Soo |
| 6,294,954 B1 | 9/2001 | Melanson |
| 7,102,427 B2 | 9/2006 | Matsumoto et al. |

(Continued)

FOREIGN PATENT DOCUMENTS

| | | |
|---|---|---|
| CN | 109462333 A | 3/2019 |
| KR | 10-2009-0084500 A | 8/2009 |

(Continued)

OTHER PUBLICATIONS

Maksimovic, D., Ph.D., "Synthesis of PWM and Quasi-Resonant DC-to-DC Power Converters", Thesis for Degree of Doctor of Philosophy, Jan. 12, 1989, pp. 1-233, California Institute of Technology, Pasadena, United States.

(Continued)

*Primary Examiner* — Khanh V Nguyen
(74) *Attorney, Agent, or Firm* — Sherman IP LLP; Kenneth L. Sherman; Hemavathy Perumal

(57) ABSTRACT

One embodiment provides a system comprising a single DC voltage source and a Class-D amplifier comprising at least one DC/DC converter operated by the single DC voltage source. The amplifier is configured to receive an input signal for power amplification, and generate, via the at least one DC/DC converter, a DC output voltage that approaches or exceeds a DC supply voltage from the single DC voltage source. A gain of the amplifier is a ratio of the output voltage level to the input signal. A steady-state operating point of the at least one DC/DC converter is zero output.

20 Claims, 18 Drawing Sheets

(56) References Cited

U.S. PATENT DOCUMENTS

| | | | |
|---|---|---|---|
| 7,633,336 B2* | 12/2009 | Bean | H03F 3/2173 |
| | | | 330/10 |
| 8,030,995 B2 | 10/2011 | Okubo et al. | |
| 9,425,622 B2* | 8/2016 | Deboy | H02M 7/4807 |
| 9,496,787 B2* | 11/2016 | Ihs | H02M 3/158 |
| 9,621,061 B2 | 4/2017 | Hayasaki et al. | |
| 9,819,266 B2* | 11/2017 | Vaidya | H03K 5/1536 |
| 10,897,233 B2* | 1/2021 | Travis | H03F 3/2178 |
| 2005/0017799 A1 | 1/2005 | Risbo et al. | |
| 2008/0019546 A1* | 1/2008 | Delano | H03F 3/68 |
| | | | 330/297 |
| 2009/0102439 A1 | 4/2009 | Williams | |
| 2013/0181523 A1 | 7/2013 | Zhang et al. | |
| 2016/0126836 A1* | 5/2016 | Schmitz | H02M 3/157 |
| | | | 323/271 |
| 2017/0063318 A1 | 3/2017 | Pazhayaveetil et al. | |
| 2017/0331374 A1 | 11/2017 | Høyerby | |
| 2018/0131289 A1 | 5/2018 | Ohnishi et al. | |

FOREIGN PATENT DOCUMENTS

| | | |
|---|---|---|
| KR | 10-1877381 | 7/2018 |
| WO | 2013107782 A2 | 7/2013 |
| WO | 2014/197399 A1 | 12/2014 |

OTHER PUBLICATIONS

International Search Report & Written Opinion dated Sep. 21, 2020 for International Application PCT/KR2020/007417 from Korean Intellectual Property Office, pp. 1-11, Republic of Korea.

* cited by examiner

BOOST AMPLIFIER

CROSS-REFERENCE TO RELATED APPLICATIONS

This application claims the priority benefit of U.S. Provisional Patent Application Ser. No. 62/858,872, filed Jun. 7, 2019, all incorporated herein by reference in their entirety

TECHNICAL FIELD

One or more embodiments relate generally to loudspeakers, and in particular, a boost amplifier for driving a loudspeaker.

BACKGROUND

A loudspeaker reproduces audio when connected to a receiver (e.g., a stereo receiver, a surround receiver, etc.), a television (TV) set, a radio, a music player, an electronic sound producing device (e.g., a smartphone), video players, etc.

SUMMARY

One embodiment provides a system comprising a single DC voltage source and a Class-D amplifier comprising at least one DC/DC converter operated by the single DC voltage source. The amplifier is configured to receive an input signal for power amplification, and generate, via the at least one DC/DC converter, an output voltage level that approaches or exceeds a DC supply voltage from the single DC voltage source. A gain of the amplifier is a ratio of the output voltage level to the input signal. A steady-state operating point of the at least one DC/DC converter is zero output.

Another embodiment provides a Class-D amplifier device comprising at least one DC/DC converter operated by a single DC voltage source. The at least one DC/DC converter is configured to receive an input signal for power amplification, and generate an output voltage level that approaches or exceeds a DC supply voltage from the single DC voltage source. The amplifier device further comprises a low-pass LC filter configured to make the output voltage level low noise. A gain of the amplifier device is a ratio of the output voltage level to the input signal. A steady-state operating point of the at least one DC/DC converter is zero output.

One embodiment provides a method comprising receiving an input signal for power amplification, and generating, via at least one DC/DC converter operated by a single DC voltage source, an output voltage level that approaches or exceeds a DC supply voltage from the single DC voltage source. A gain of the power amplification is a ratio of the output voltage level to the input signal. A steady-state operating point of the at least one DC/DC converter is zero output.

These and other features, aspects and advantages of the one or more embodiments will become understood with reference to the following description, appended claims, and accompanying figures.

DETAILED DESCRIPTION

Figure 1:
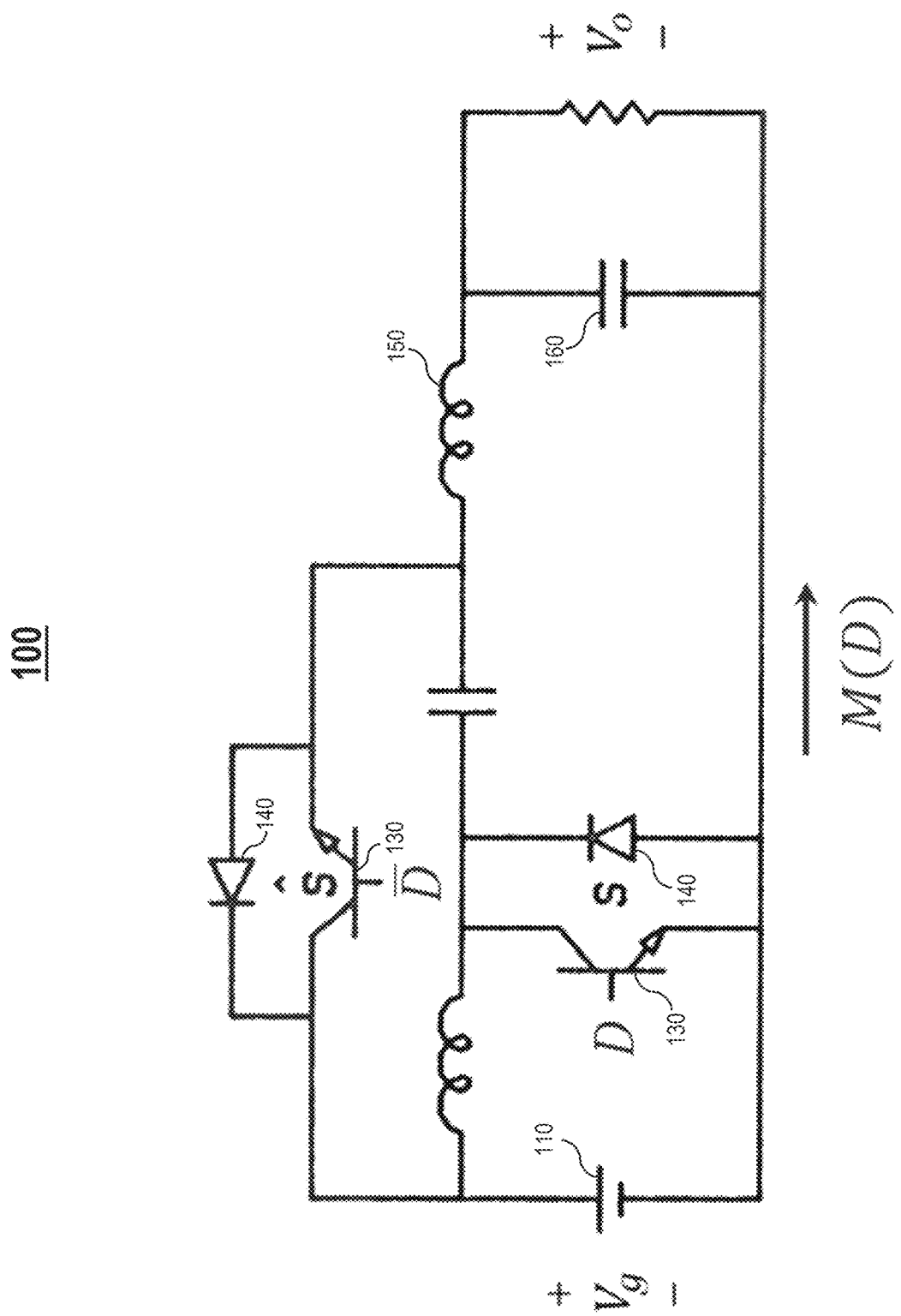
FIG. 1 illustrates an example topology of a DC/DC converter.

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to loudspeakers, and in particular, a boost amplifier for driving a loudspeaker. One embodiment provides a system comprising a single DC voltage source and a Class-D amplifier comprising at least one DC/DC converter operated by the single DC voltage source. The amplifier is configured to receive an input signal for power amplification, and generate, via the at least one DC/DC converter, an output voltage level that approaches or exceeds a DC supply voltage from the single DC voltage source. A gain of the amplifier is a ratio of the output voltage level to the input signal. A steady-state operating point of the at least one DC/DC converter is zero output.

Another embodiment provides a Class-D amplifier device comprising at least one DC/DC converter operated by a single DC voltage source. The at least one DC/DC converter is configured to receive an input signal for power amplification, and generate an output voltage level that approaches or exceeds a DC supply voltage from the single DC voltage source. The amplifier device further comprises a low-pass LC filter configured to make the output voltage low noise. A gain of the amplifier device is a ratio of the output voltage level to the input signal. A steady-state operating point of the at least one DC/DC converter is zero output.

One embodiment provides a method comprising receiving an input signal for power amplification, and generating, via at least one DC/DC converter operated by a single DC voltage source, an output voltage level that approaches or exceeds a DC supply voltage from the single DC voltage source. A gain of the power amplification is a ratio of the output voltage level to the input signal. A steady-state operating point of the at least one DC/DC converter is zero output.

For expository purposes, the terms "loudspeaker", "loudspeaker device", "loudspeaker system", and "audio system" may be used interchangeably in this specification.

For expository purposes, the terms "Class-D amplifier", "power amplifier", and "boost amplifier" may be used interchangeably in this specification.

Audio amplifiers are applicable in many audio applications. Most present day electronic devices include audio systems. Typically, an audio system comprises a transducer (i.e., speaker driver) for reproducing sound and an audio amplifier for driving the transducer to reproduce the sound. The audio amplifier generates a power signal that in turn is converted into sound waves by the transducer. The quality of sound reproduced by the transducer depends on several factors. To achieve high-quality audio reproduction, all processes in an audio chain of the system need to be of high quality. The audio amplifier performs one of the processes in the audio chain, converting a low power signal to a high power signal, capable of driving the transducer through its designed operating range (i.e., usable range). Even if the transducer is capable of greater output and deeper bass, the system is limited by insufficient voltage available from the audio amplifier to drive the transducer through its usable range.

A crest-factor of a signal is defined as a ratio of a peak level of the signal to a root-mean-square (rms) level of the signal. A crest-factor is usually expressed in decibels (dB).

In audio applications, a loudspeaker is used in reproduction of sound, such as reproduction of music. A loudspeaker includes at least one speaker driver (i.e., transducer) for reproducing sound. A high crest-factor characterizes music and speech. For example, most music and speech is characterized by crest-factors in the range of 6-20 dB, which means that peak levels are much higher than rms levels for most music and speech. To accurately reproduce music or speech, audio applications involving loudspeakers require amplifiers with high peak output voltage capability for relatively short periods of time, with relatively long periods between peaks. Further, an audio system incorporating non-linear control to reduce audio distortion (i.e., audible distortion) requires an even greater peak voltage, thereby compounding demands on an amplifier connected to the loudspeaker. Utilizing a conventional amplifier without high peak output voltage capability and without nonlinear control results in increased audio distortion and reduced output voltage capability. Alternatively, an audio system that utilizes a conventional high-voltage amplifier and a separate boost converter to boost a DC supply voltage to the amplifier adds cost and complexity, and reduces overall efficiency of the system.

Embodiments of the invention provide an audio amplifier that can operate from a single low-voltage DC power supply, that can provide an output voltage level required to drive a transducer through its designed operating range (i.e., usable range), and that can deliver a high crest-factor.

Embodiments of the invention provide a Class-D power amplifier with an output voltage capability that can deliver output voltage levels that are greater than a DC supply voltage to the power amplifier. In one embodiment, the power amplifier utilizes DC/DC converter technology to simultaneously boost an output voltage and amplify an input signal to the power amplifier. The power amplifier is capable of delivering high peak output voltage levels while operating from a comparatively low-voltage DC supply voltage. This obviates the need and complexity of utilizing a greater DC supply voltage (e.g., a conventional high-voltage amplifier) and/or additional processing (e.g., a separate boost DC/DC converter to boost a DC supply voltage) to achieve equivalent output voltage. Further, as the power amplifier operates from a single power supply, it does not exhibit bus pumping. Bus pumping occurs in dual power supply amplifier systems. When a dual power supply system is under load, energy from one power supply of the system pumps into the other power supply of the system, resulting in bus pumping. Bus pumping can lead to excess voltage stress and amplifier failure. The power amplifier of the invention is unlike a conventional full-bridge Class-D power amplifier that can only deliver a maximum output voltage that is limited to a DC supply voltage to the full-bridge Class-D power amplifier.

Embodiments of the invention can be used in a broad range of applications (e.g., audio applications, power applications, etc.) such as, but not limited to, the following: computers, televisions (TVs), smart devices (e.g., smart TVs, smart phones, etc.), soundbars, subwoofers, wireless and portable speakers, mobile phones, headphones, earbuds, car speakers, augmented reality/virtual reality (AR/VR) technologies, radio frequency (RF) amplifiers, envelope-tracking amplifiers, servo amplifiers, DC/AC power inverters, etc. For example, the power amplifier can be used as an audio amplifier for a cell phone with a low voltage battery. The audio amplifier can provide greater output voltage to drive the cell phone's loudspeaker, and deliver greater sound output with reduced audio distortion. As another example, the power amplifier can be used as a micro-inverter for solar panels, converting DC power from a solar panel into AC power on the utility line.

Let $V_g$ generally denote a DC supply voltage (i.e., source voltage), let $V_o$ generally denote an amplifier output voltage, and let $V_{in}$ generally denote an input voltage of an input signal (e.g., an input audio signal) for amplification. An output voltage $V_o$ can have an instantaneous output voltage level.

FIG. 1 illustrates an example topology of a DC/DC converter 100. The DC/DC converter 100 is operated by a single DC voltage source (i.e., power supply) 110. The voltage source 110 is configured to supply the DC/DC converter 100 with a DC supply voltage (i.e., source voltage) $V_g$.

The DC/DC converter 100 comprises at least two switches. For example, as shown in FIG. 1, the DC/DC converter 100 comprises two switches, i.e., a first switch S and a second switch Ŝ. The second switch Ŝ is driven complementary to the first switch S. Specifically, the second switch Ŝ is off whenever the first switch S is on, and the second switch Ŝ is on whenever the first switch S is off.

In addition, a short interval or period generally referred to as "dead-time" may be introduced into the logic during which both active switches are off. The dead-time occurs because real semiconductor devices cannot switch instantaneously. The dead-time provides an interval or period during which on-to-off and off-to-on transitions of the switches may occur. Typically, these dead-time intervals/periods are small and are negligible for the purpose of most analysis.

In one embodiment, each switch S, Ŝ comprises an active switch and a passive switch in parallel. For example, as shown in FIG. 1, each switch S, Ŝ is a transistor-diode pair including a transistor 130 (as active switch) and a diode 140 (as passive switch) in parallel.

A duty ratio is a ratio of "on-time" to a total switching period of a switch. Let D generally denote a duty ratio, and let $\overline{D}$ generally denote a complementary duty ratio of the duty ratio D, wherein $\overline{D} \triangleq 1-D$.

The DC/DC converter 100 is configured to generate an output voltage $V_o$. The DC/DC converter 100 is driven based on a duty ratio D. Specifically, as shown in FIG. 1, the DC/DC converter 100 generates the output voltage $V_o$ by driving (i.e., turning on/off) the first switch S and the second switch Ŝ based on the duty ratio D and the complementary duty ratio $\overline{D}$, respectively.

The DC/DC converter 100 comprises a low-pass LC filter that includes, at each output terminal, an inductor 150 and a capacitor 160 connected together. The low-pass LC filter is used to make the output voltage $V_o$ low noise.

Let M generally denote a DC conversion ratio (or DC gain) of a DC/DC converter. A DC conversion ratio M (D) of the DC/DC converter 100 driven based on the duty ratio D is a ratio of the output voltage $V_o$ to the supply voltage $V_g$, as represented in accordance equation (1) provided below:

$$M(D) \triangleq \frac{V_o}{V_g} = \frac{1-2D}{1-D}, \quad (1)$$

wherein $0 \le D \le 1$.

Figure 2:
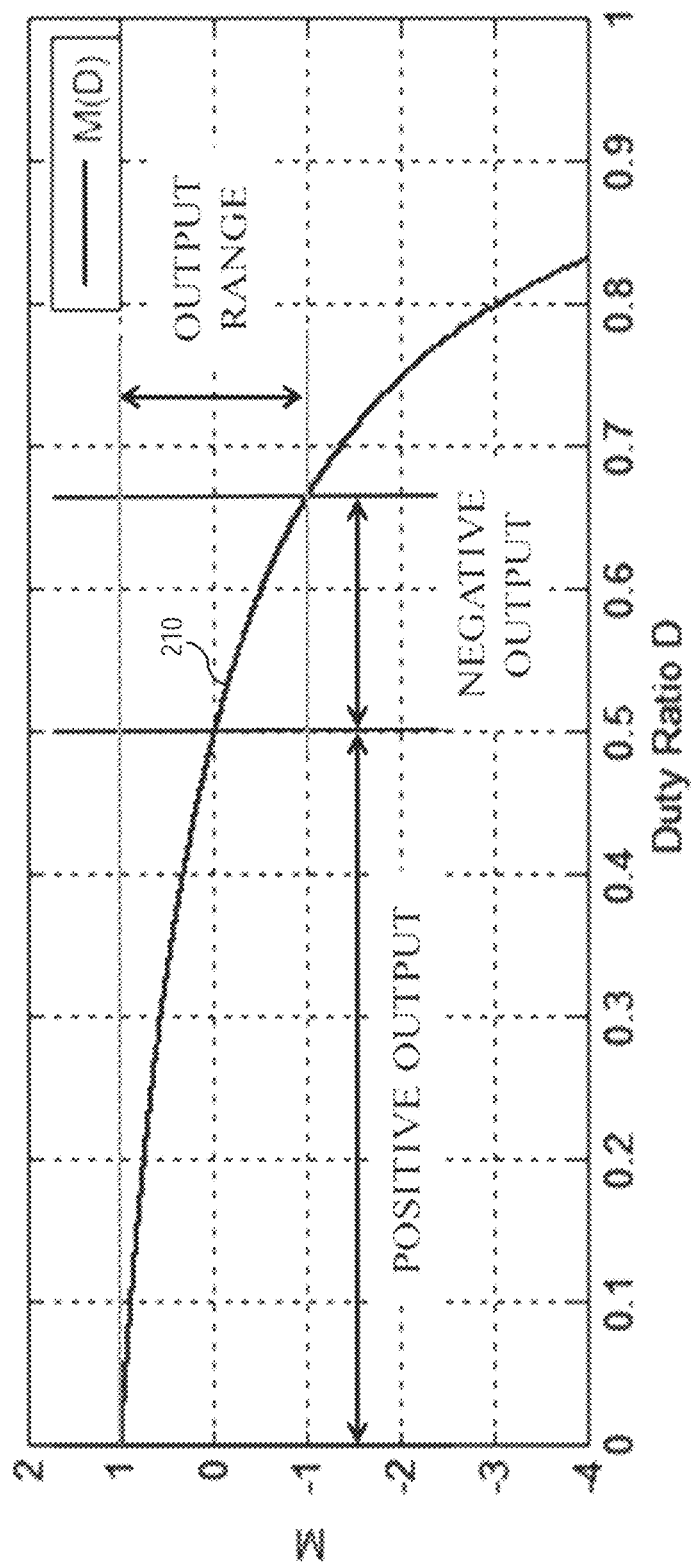
FIG. 2 is an example graph illustrating a DC conversion ratio of the DC/DC converter.

FIG. 2 is an example graph 200 illustrating a DC conversion ratio M(D) of a DC/DC converter 100. A horizontal axis of the graph 200 represents a duty ratio D, wherein $0 \le D \le 1$. A vertical axis of the graph 200 represents a DC conversion ratio M. The graph 200 comprises a curve 210 representing the DC conversion ratio M(D) of the DC/DC converter 100 driven based on the duty ratio D (in accordance with equation (1) provided above).

As shown in FIG. 2, the DC conversion ratio M(D) is in the output range of [-1, 1] as the duty ratio D varies from zero to 0.67. Specifically, the output voltage $V_o$ is zero if D=0.5, positive if D<0.5 (i.e., varying the duty ratio D from 0.5 to zero yields positive output), and negative if D>0.5 (i.e., varying the duty ratio D from 0.5 to 1 yields negative output).

Embodiments of the invention provide a single-ended boost amplifier (e.g., single-ended boost amplifier 360 in FIG. 3 or single-ended boost amplifier 500 in FIG. 5) configured to deliver power amplification of an input signal (e.g., an input audio signal) utilizing the DC/DC converter 100 to produce output voltages $V_o$ that approach $+V_g$ for positive swings and exceed $-V_g$ for negative swings, all from a single DC voltage source supplying a supply voltage $V_g$. As shown in FIG. 2, the single-ended boost amplifier can step-up the output voltage $V_o$ (i.e., boost the output voltage $V_o$) in the negative polarity.

Embodiments of the invention provide a differential boost amplifier (e.g., differential boost amplifier 600 in FIG. 7 or differential boost amplifier 1100 in FIG. 12) configured to deliver power amplification of an input signal (e.g., an input audio signal) utilizing two DC/DC converters 100 that are operated differentially to produce output voltages $V_o$ that exceed $+V_g$ for positive swings and exceed $-V_g$ for negative swings, all from a single DC voltage source supplying a supply voltage $V_g$. The differential boost amplifier can step-up the output voltage $V_o$ (i.e., boost the output voltage $V_o$) in both polarities (i.e., negative polarity and positive polarity).

Figure 3:
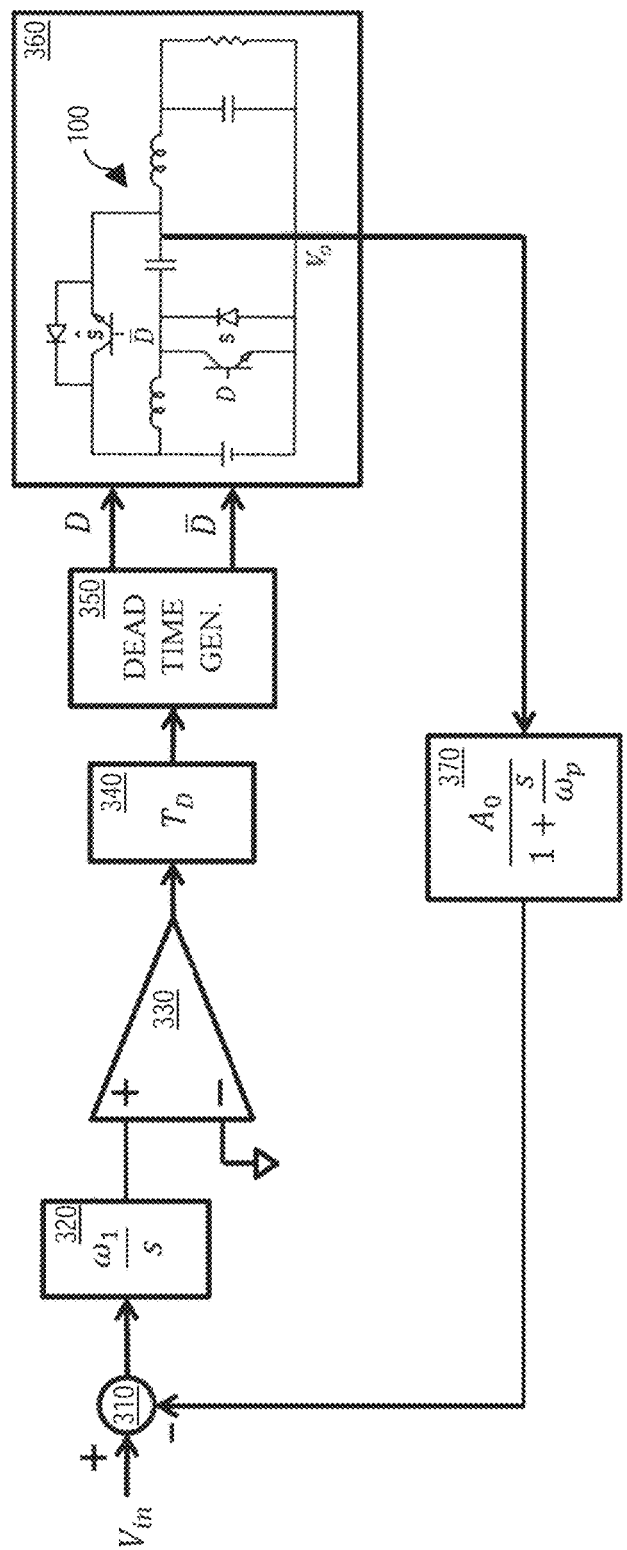
FIG. 3 illustrates an example amplifier system including a single-ended boost amplifier with feedback control, in accordance with an embodiment.

FIG. 3 illustrates an example amplifier system 300 including a single-ended boost amplifier 360 with feedback control, in accordance with an embodiment. The single-ended boost amplifier 360 comprises a single DC/DC converter 100. The single-ended boost amplifier 360 is configured to deliver power amplification of an input signal (e.g., an input audio signal) to the system 300 utilizing the DC/DC converter 100.

The system 300 implements feedback control for the single-ended boost amplifier 360 via a control loop (i.e., controller) configured to control the switches S and Ŝ of the DC/DC converter 100. In one embodiment, the control loop of the system 300 includes at least one of the following: (1) an input summing unit 310, (2) an integrator unit 320, (3) a comparator unit 330, (4) a time-delay unit 340, (5) a dead-time generator unit 350, and (6) a feedback processing unit 370.

In one embodiment, the input summing unit 310 is configured to: (1) receive an input signal (e.g., an input audio signal) with an input voltage $V_{in}$, (2) subtract from the input signal a scaled version (i.e., scaled by a scale factor $A_o$) of an output voltage $V_o$ (from the feedback processing unit 370), and (3) generate an error signal as output to feed to the integrator unit 320, wherein the error signal represents a difference between the input voltage $V_{in}$ and the scaled version of the output voltage $V_o$.

In one embodiment, the integrator unit 320 is configured to: (1) receive an error signal (e.g., an error signal representing a difference between an input voltage $V_{in}$ and a scaled version of tan output voltage $V_o$ from the input summing unit 310), (2) integrate the error signal with respect to time, and (3) feed the time-integrated error signal to the comparator unit 330.

In one embodiment, the comparator unit 330 is configured to: (1) receive an input voltage at its positive input terminal (e.g., a time-integrated error signal from the integrator unit 320), (2) compare the input voltage at its positive input terminal against a reference voltage at its negative input terminal (e.g., circuit ground), and (3) produce a digital output signal based on the comparison (e.g., logic high if the input voltage at its positive input terminal is greater than the reference voltage at its negative input terminal, and logic low if the input voltage at the positive input terminal is less than the reference voltage at the negative input terminal).

In one embodiment, the time-delay unit 340 is configured to: (1) receive an input voltage (e.g., a digital output signal from the comparator unit 330), and (2) implement a short time-delay of the input signal for a predetermined amount of time $T_D$ (e.g., a small delay, such as 20 ns). The time-delay prevents switching of the power switches at the instant inputs to the comparator unit 330 cross over, thereby enhancing immunity of the system 300 to switching noise. The time-delay also introduces a phase-lag into the control loop as part of the control of the switching frequency.

In one embodiment, the dead-time generator unit 350 is configured to: (1) receive an input signal (e.g., an output signal from the time-delay unit 340), and (2) implement a dead-time period for the DC/DC converter 100 (i.e., a period when both switches of the DC/DC converter 100 are off) by generating, based on the input signal, drive signals for each of the switches S and S corresponding to a duty ratio D and a complementary duty ratio $\overline{D}$ for use in driving the DC/DC converter 100.

In one embodiment, the single-ended boost amplifier 360 is configured to: (1) receive drive signals for each of the switches S and S corresponding to a duty ratio D and a complementary duty ratio $\overline{D}$ (e.g., from the dead-time generator unit 350), and (2) generate an output voltage $V_o$ with an instantaneous output voltage level by driving (i.e., turning on/off) the first switch S and the second switch $\hat{S}$ of the DC/DC converter 100 based on the duty ratio D and the complementary duty ratio $\overline{D}$, respectively. A loudspeaker device (e.g., loudspeaker device 1340 in FIG. 14) connected to the boost amplifier 360 is driven by the output voltage $V_o$.

In one embodiment, the system 300 measures/senses the output voltage $V_o$ before a low-pass LC filter of the DC/DC converter 100, and provides the output voltage $V_o$ measured/sensed as an output voltage feedback signal to the feedback processing unit 370. In another embodiment, the system 300 measures/senses the output voltage $V_o$ after the low-pass LC filter of the DC/DC converter 100, taking into account an additional phase-lag introduced by the low-pass LC filter in a self-oscillating design of the control loop. In another embodiment, the low-pass LC filter may be omitted entirely, utilizing the low-pass properties of a loudspeaker driver to filter out the switching frequency components.

In one embodiment, the feedback processing unit 370 is configured to: (1) receive an output voltage feedback signal (e.g., from the single-ended boost amplifier 360), (2) scale the output voltage feedback signal by a (positive or negative) scale factor $A_o$, and (3) apply a low-pass filter to suppress the switching frequency and its harmonics in the output voltage feedback signal. The gain of the boost amplifier 360 is calculated from the scale factor $A_o$, wherein the gain approaches $1/A_0$ (e.g., a scale factor $A_o$ of 0.1 yields an amplifier gain approaching 10). A pole of the low-pass filter $\omega_p$ is chosen to attenuate the switching frequency and its harmonics in the output voltage feedback signal, and contributes to the phase-lag that determines the switching frequency in a self-oscillating design. The single-ended boost amplifier 360 amplifies an input signal with an input voltage $V_{in}$ to the system 300 based on the gain.

The system 300 is a complete single-ended self-oscillating boost amplifier. In one embodiment, the control loop of the system 300 is designed as an asynchronous modulator, where switching frequencies of the switches S and $\hat{S}$ are variable and based on gain and phase of the control loop. This design provides a large low-frequency loop gain and allows the single-ended boost amplifier 360 to oscillate at a desired switching frequency, typically well above a desired bandwidth. The large low-frequency loop gain provides high performance in terms of distortion rejection and low output impedance. In another embodiment, the control loop of the system 300 is designed based on one or more other strategies, such as, but not limited to, hysteresis control, open loop control, fixed-frequency pulse-width modulation (PWM) control, etc.

To generate a desired output voltage $V_o$, the duty ratio D can be calculated based on a relationship between the duty ratio D and a DC conversion ratio M(D) of the single-ended boost amplifier 360 (e.g., in accordance with equation (1) provided above), resulting in a single-ended open-loop design capable of peak output voltages $\pm V_g$ from a single DC voltage source supplying a supply voltage $V_g$ with open-loop control.

The single-ended boost amplifier 360 simultaneously boosts the output voltage $V_o$ and amplifies the input signal to the system 300.

For the single-ended boost amplifier 360, the input voltage $V_{in}$ and the output voltage $V_o$ share a common ground. This is important for audio applications involving headphones or earbuds, because such devices typically share a ground terminal between right and left channels.

Figure 4:
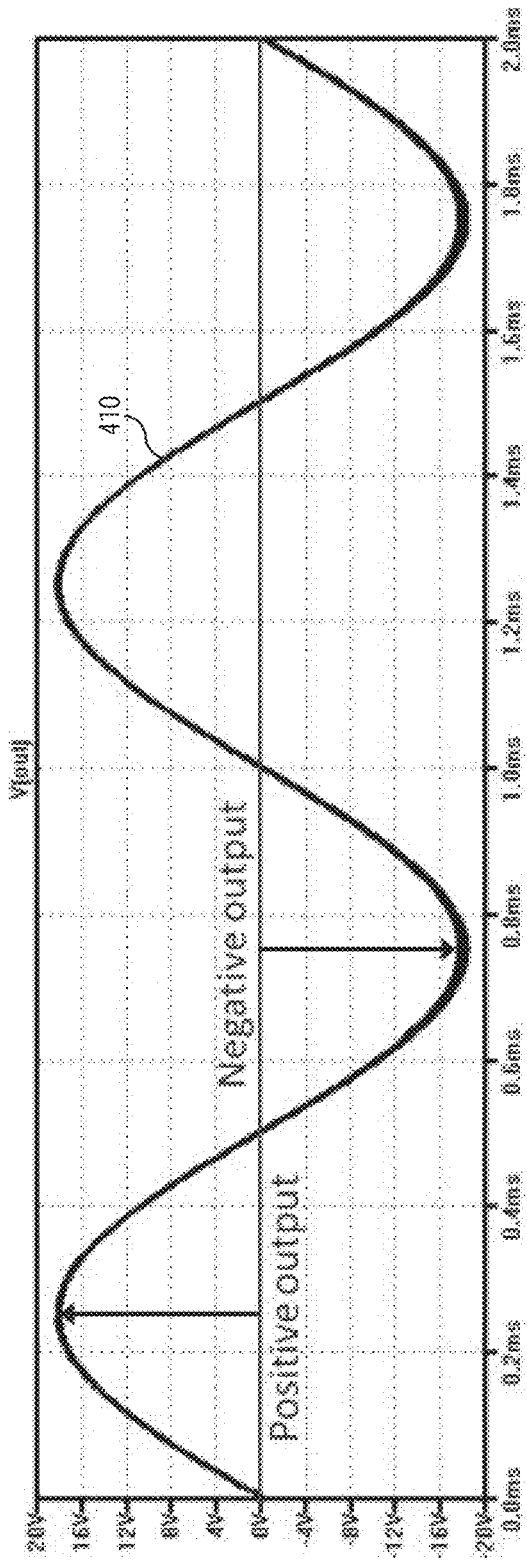
FIG. 4 is an example graph illustrating sinusoidal output voltage generated by the single-ended boost amplifier, in accordance with an embodiment.

FIG. 4 is an example graph 400 illustrating sinusoidal output voltage $V_o$ generated by a single-ended boost amplifier 360, in accordance with an embodiment. A horizontal axis of the graph 400 represents time in milliseconds (ms). A vertical axis of the graph 400 represents a magnitude of the output voltage $V_o$ in volts (V). Assume the single-ended boost amplifier 360 is operated from a single DC voltage source supplying a supply voltage $V_g$ of 20V. The graph 400 comprises a curve 410 representing the output voltage $V_o$ with 1 kHz sinusoidal input.

As shown in FIG. 4, the single-ended boost amplifier 360 is capable of generating positive output, negative output, and zero output. The single-ended boost amplifier 360 is DC-coupled and shares its ground connection with an output load. The single-ended boost amplifier 360 is capable of boosting the output voltage $V_o$ in the negative polarity only, and is limited by the positive supply rail in the positive polarity. As shown in FIG. 4, the amplifier 360 is capable of producing peak output voltages of ±18V (i.e., peak output voltages approaching ±20V).

Figure 5:
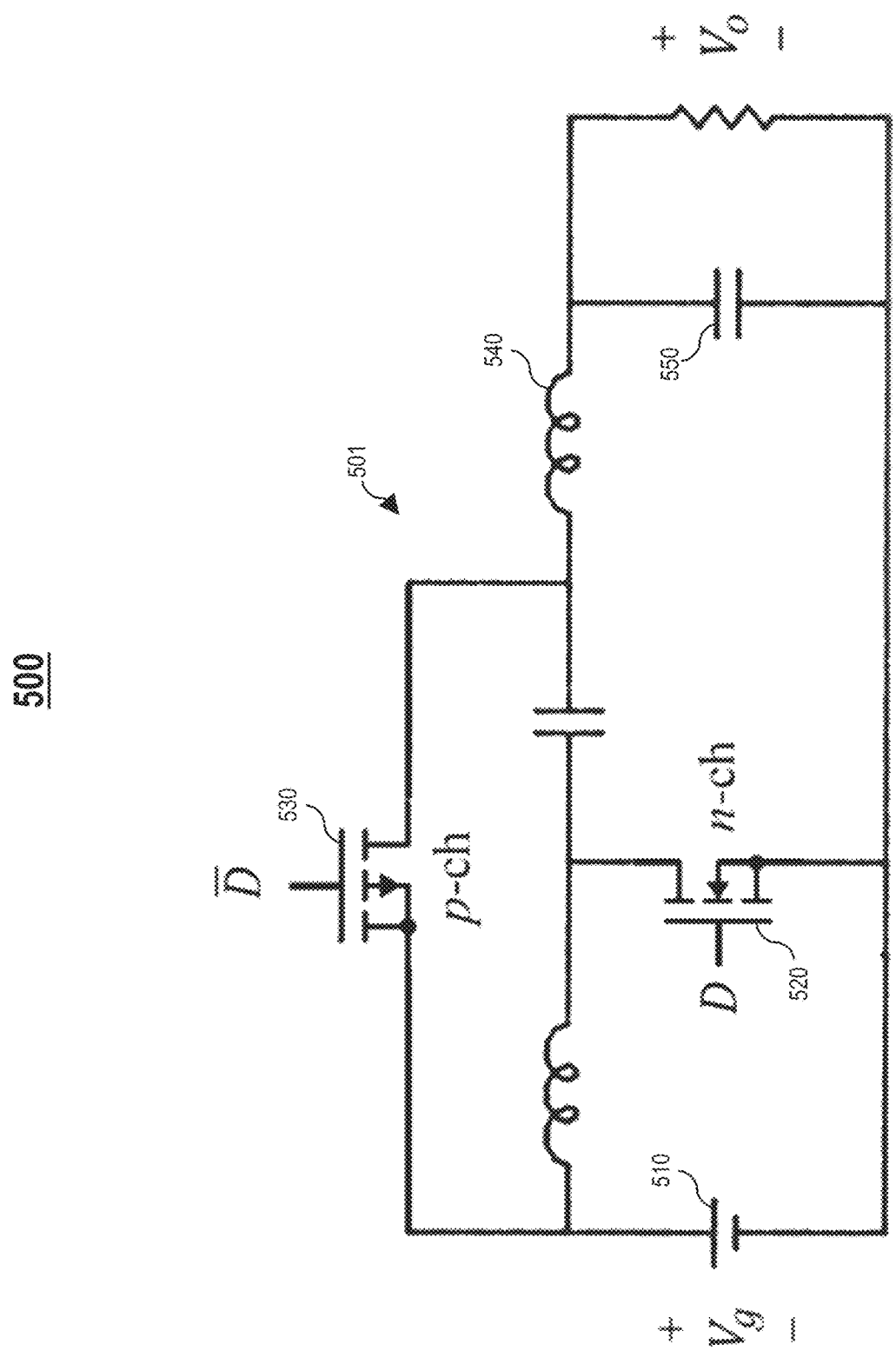
FIG. 5 illustrates another example single-ended boost amplifier, in accordance with an embodiment.

FIG. 5 illustrates another example single-ended boost amplifier 500, in accordance with an embodiment. The single-ended boost amplifier 500 comprises a single DC/DC converter 501 arranged in accordance with the topology of the DC/DC converter 100 (FIG. 1), with the exception that the switches of the DC/DC converter 100 are replaced with Metal Oxide Semiconductor Field Effect Transistors (MOSFETs) in the DC/DC converter 501. Specifically, the DC/DC converter 501 comprises an n-channel MOSFET 520 and a p-channel MOSFET 530 that are utilized as switches. The DC/DC converter 501 is operated by a single DC voltage source 510. The voltage source 510 is configured to supply the DC/DC converter 501 with a DC supply voltage (i.e., source voltage) $V_g$.

Each of the MOSFETs 520, 530 incorporates an intrinsic body diode in parallel with a transistor, where the body diode serves as a passive switch, such that no additional parallel diode is necessary for bidirectional current flow. The p-channel MOSFET 530 is driven complementary to the n-channel MOSFET 520. Specifically, the p-channel MOSFET 530 is off whenever the n-channel MOSFET 520 is on, and the p-channel MOSFET 530 is on whenever the n-channel MOSFET 520 is off.

As shown in FIG. 5, to drive the p-channel MOSFET 530 complementary to the n-channel MOSFET 520, the n-channel MOSFET 520 is driven by the duty ratio D, and the p-channel MOSFET 530 is driven by the complementary duty ratio $\overline{D}$.

The single-ended boost amplifier 500 generates an output voltage $V_o$. The DC/DC converter 501 comprises a low-pass LC filter that includes, at each output terminal, an inductor 540 and a capacitor 550 connected together. The low-pass LC filter is used to make the output voltage $V_o$ low noise.

In one embodiment, feedback control for the single-ended boost amplifier 500 is implemented using the control loop of the amplifier system 300 (FIG. 3).

In another embodiment, a single-ended boost amplifier comprises a single DC/DC converter that utilizes other combinations of MOSFETs or other types of power switches such as, but not limited to, a combination of two n-channel MOSFETs, a combination of two p-channel MOSFETs, Insulated Gate Bipolar Transistors (IGBTs), gallium nitride (GaN) devices, silicon carbide devices, or any other types or combinations of power switches.

For the single-ended boost amplifier 500, the input voltage $V_{in}$ and the output voltage $V_o$ share a common ground. This is important for audio applications involving headphones or earbuds, because such devices typically share a ground terminal between right and left channels. In addition, the design of the boost amplifier 500 is inherently immune from click and pop noises as an operating point of output from the amplifier 500 is zero (i.e., the output does not need to establish a new operating point when the boost amplifier 500 is turned on and off, so the output is inherently void of click and pop noises).

Figure 6:
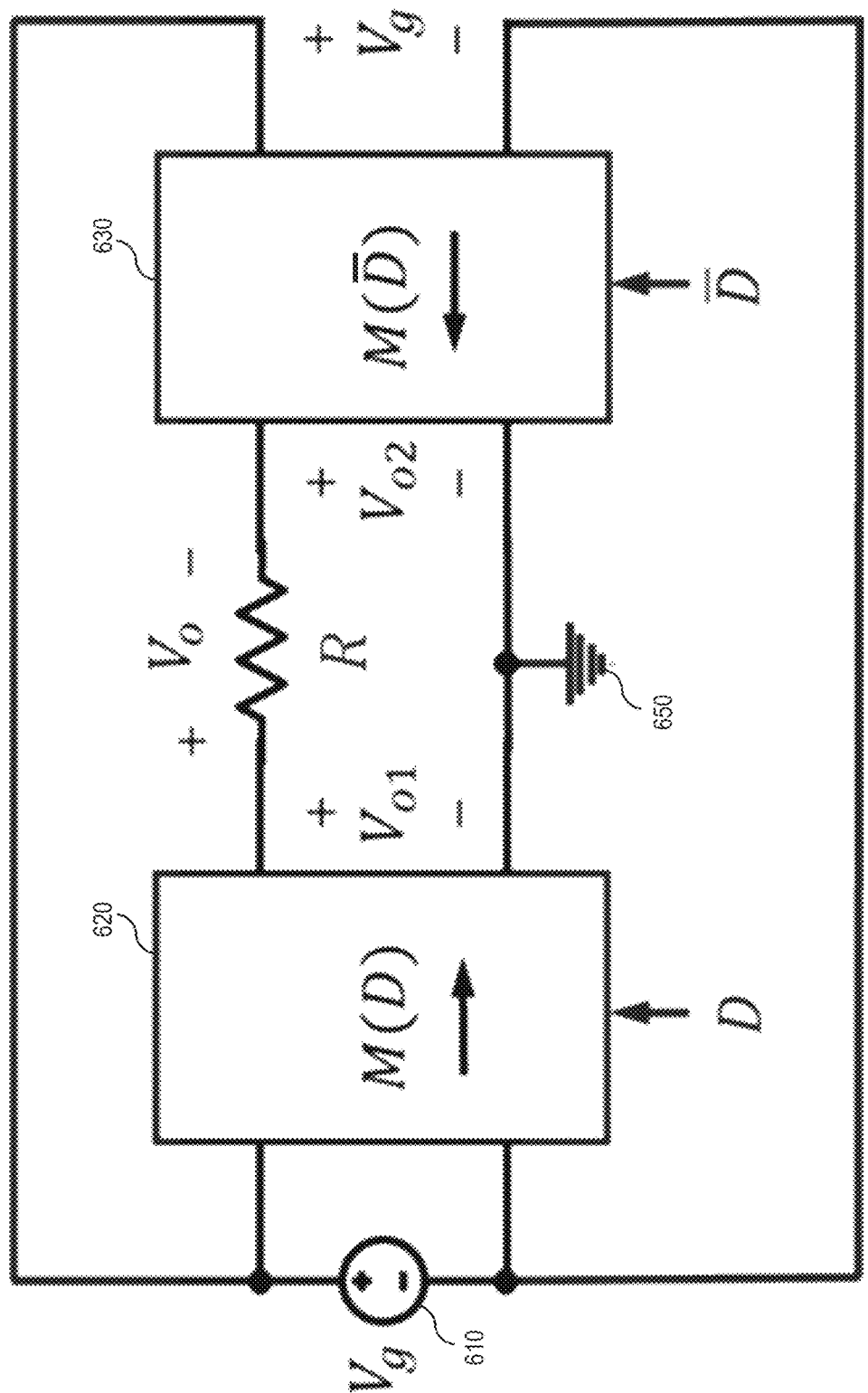
FIG. 6 illustrates an example differential boost amplifier, in accordance with an embodiment.

FIG. 6 illustrates an example differential boost amplifier 600, in accordance with an embodiment. The differential boost amplifier 600 comprises two DC/DC converters, i.e., a first DC/DC converter 620 and a second DC/DC converter 630. Each DC/DC converter 620, 630 is arranged in accordance with the topology of the DC/DC converter 100 (FIG. 1). The two DC/DC converters 620 and 630 are operated by a single DC voltage source 610. The voltage source 610 is configured to supply the two DC/DC converters 620 and 630 with a DC supply voltage (i.e., source voltage) $V_g$. An output load R is connected across output terminals of the two DC/DC converters 620 and 630, and the two DC/DC converters 620 and 630 share a common ground 650.

In one embodiment, the first DC/DC converter 620 and the second DC/DC converter 630 are driven in complementary fashion based on a duty ratio D and a complementary duty ratio $\overline{D}$, respectively.

The differential boost amplifier 600 is configured to provide power amplification of an input signal (e.g., an input audio signal) to the amplifier 600 based on a differential connection of the two DC/DC converters 620 and 630. Specifically, the differential boost amplifier 600 is configured to generate an output voltage $V_o$ that is the differential output voltage measured across the output terminals of the two DC/DC converters 620 and 630, as represented in accordance with equation (2) provided below:

$$V_o = V_{o1} - V_{o2} = M(D)V_g - M(\overline{D})V_g \tag{2}$$

wherein $V_{o1}$ is an individual output voltage generated by the first DC/DC converter 620, and $V_{o2}$ is an individual output voltage generated by the second DC/DC converter 630.

Figure 7:
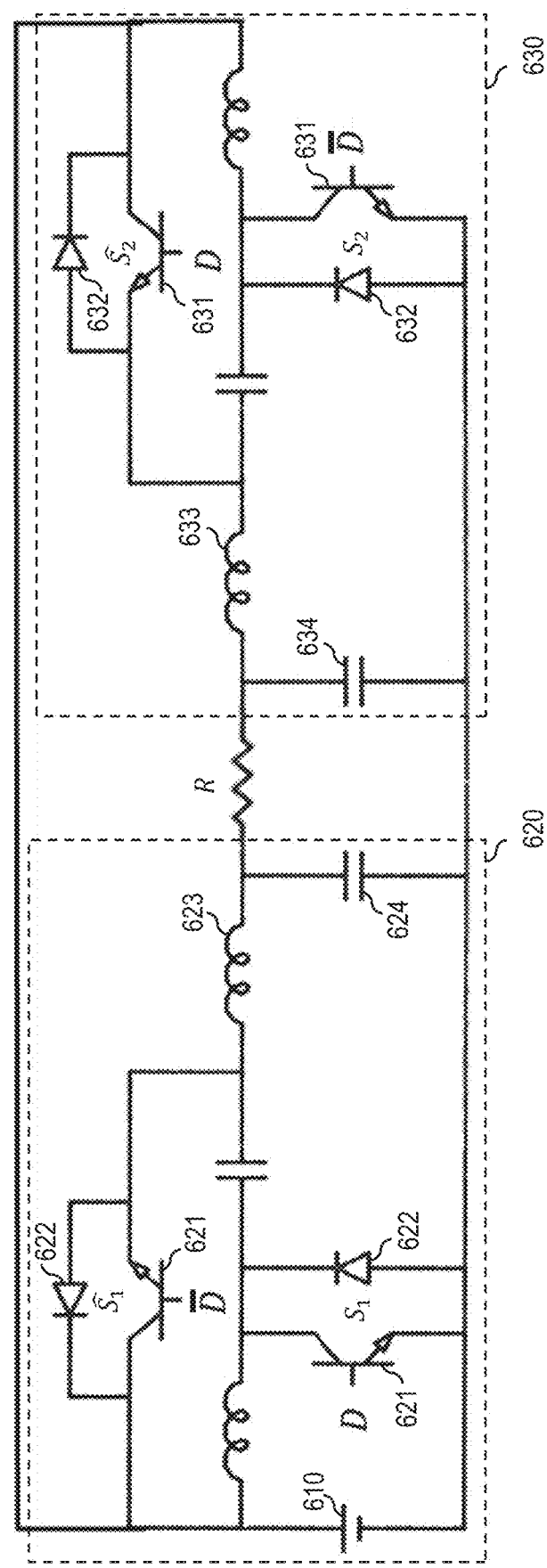
FIG. 7 illustrates two DC/DC converters of the differential boost amplifier in FIG. 6 in detail, in accordance with an embodiment.

FIG. 7 illustrates two DC/DC converters 620 and 630 of the differential boost amplifier 600 in FIG. 6 in detail, in accordance with an embodiment. As shown in FIG. 7, each DC/DC converter 620, 630 comprises two switches. Specifically, the first DC/DC converter 620 comprises a first switch $S_1$ and a second switch $\bar{S}_1$, wherein the second switch $\bar{S}_1$ is driven complementary to the first switch $S_1$. The second DC/DC converter 630 comprises a first switch $S_2$ and a second switch $\bar{S}_2$, wherein the second switch $\bar{S}_2$ is driven complementary to the first switch $S_2$.

In one embodiment, each switch $S_1$, $\bar{S}_1$, $S_2$, and $\bar{S}_2$ comprises an active switch and a passive switch in parallel. For example, as shown in FIG. 7, each switch $S_1$, $\bar{S}_1$ is a transistor-diode pair including a transistor 621 (as active switch) and a diode 622 (as passive switch) in parallel, and each switch $S_2$, $\bar{S}_2$ is a transistor-diode pair including a transistor 631 (as active switch) and a diode 632 (as passive switch) in parallel.

The first DC/DC converter 620 is configured to generate an individual output voltage $V_{o1}$ by driving (i.e., turning on/off) the first switch $S_1$ and the second switch $\bar{S}_1$ based on the duty ratio D and the complementary duty ratio $\overline{D}$, respectively. The first DC/DC converter 620 comprises a low-pass LC filter that includes, at each output terminal, an inductor 623 and a capacitor 624 connected together.

The second DC/DC converter 630 is configured to generate an individual output voltage $V_{o2}$ by driving (i.e., turning on/off) the first switch $S_2$ and the second switch $\bar{S}_2$ based on the complementary duty ratio $\overline{D}$ and the duty ratio D, respectively. The second DC/DC converter 630 comprises a low-pass LC filter that includes, at each output terminal, an inductor 633 and a capacitor 634 connected together.

Let $M_{dm}$ generally denote a differential-mode DC conversion ratio of a differentially connected pair of DC/DC converters like those of FIG. 6 or 7. Similarly, let $M_{cm}$ generally denote a common-mode DC conversion ratio of a differentially connected pair of DC/DC converters. A differential-mode DC conversion ratio $M_{dm}(D)$ and a common-mode DC conversion ratio $M_{cm}(D)$ of a differential boost amplifier formed by a differentially connected pair of DC/DC converters driven based on a duty ratio D and a complementary duty ratio $\overline{D}$ are represented in accordance with equations (3)-(4) provided below:

$$M_{dm}(D) \triangleq \frac{V_o}{V_g} = M(D) - M(\overline{D}), \text{ and} \tag{3}$$

$$M_{cm}(D) \triangleq \frac{V_{cm}}{V_g} = \frac{1}{2}[M(D) + M(\overline{D})], \tag{4}$$

wherein $V_o$ is the differential output voltage appearing across the output terminals of the two DC/DC converters, and $V_{cm}$ is an average output voltage appearing at the output terminals of the two DC/DC converters, with respect to ground.

Figure 8:
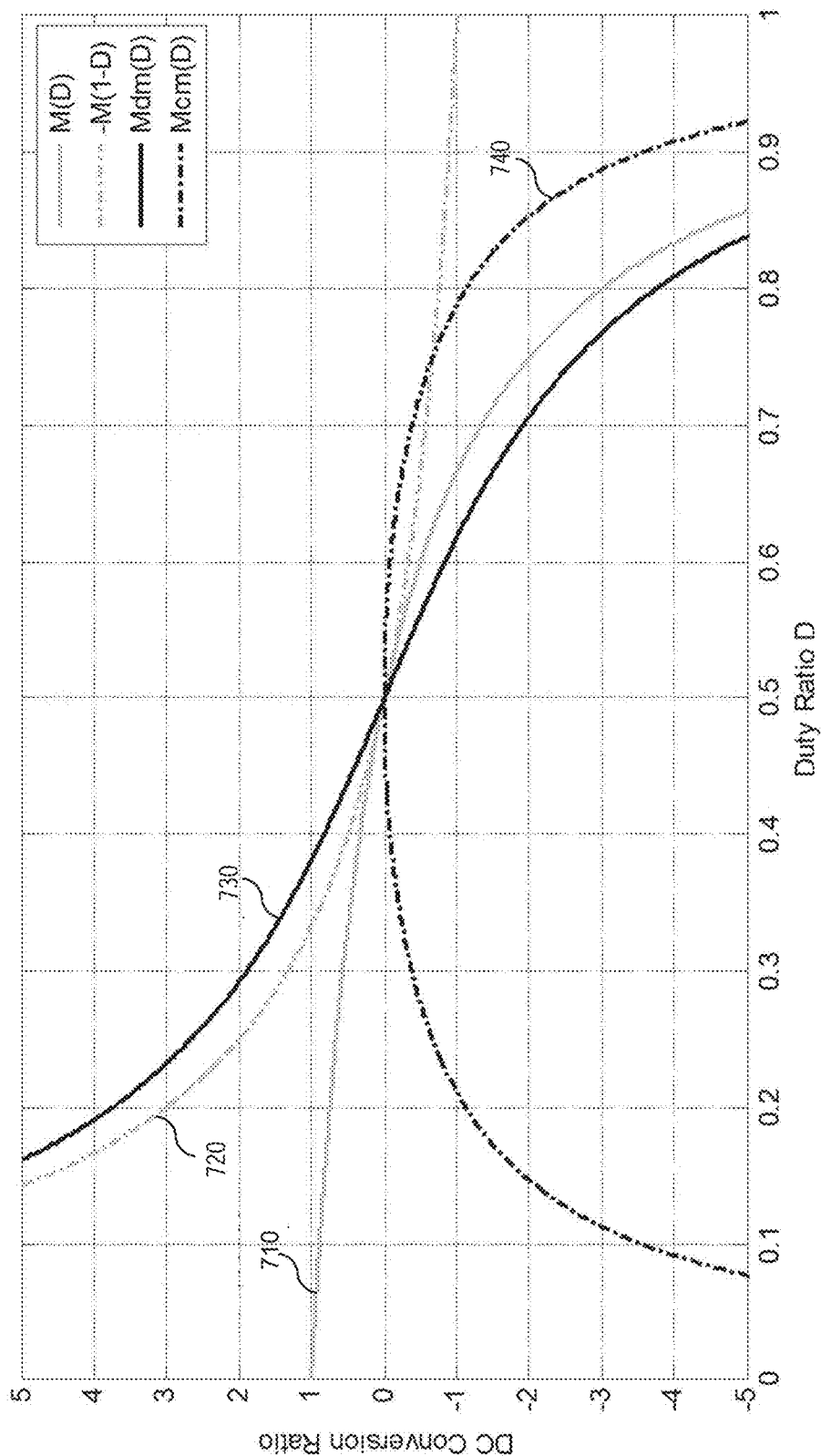
FIG. 8 is an example graph illustrating different DC conversion ratios of the differential boost amplifier, in accordance with an embodiment.

FIG. 8 is an example graph 700 illustrating different DC conversion ratios of a differential boost amplifier 600, in accordance with an embodiment. A horizontal axis of the graph 700 represents a duty ratio D, wherein $0 \leq D \leq 1$. A vertical axis of the graph 700 represents a DC conversion ratio M. The graph 700 comprises: (1) a first curve 710 representing a DC conversion ratio M(D) of the first DC/DC converter 620 driven based on the duty ratio D, (2) a second curve 720 representing a negative DC conversion ratio $-M(\overline{D})$ of the second DC/DC converter 630 driven based on the complementary duty ratio $\overline{D}$, (3) a third curve 730 representing a differential-mode DC conversion ratio $M_{dm}(D)$ of the differential boost amplifier 600 (in accordance with equation (3) provided above), and (4) a fourth curve 740 representing a common-mode DC conversion ratio $M_{cm}(D)$ of the differential boost amplifier 600 (in accordance with equation (4) provided above).

As shown in FIG. 8, the differential-mode DC conversion ratio $M_{dm}(D)$ shows odd symmetry about D=0.5, and the common-mode DC conversion ratio $M_{cm}(D)$ shows even symmetry. Both the differential-mode DC conversion ratio $M_{dm}(D)$ and the common-mode DC conversion ratio $M_{cm}(D)$ are zero for D=0.5.

The differential boost amplifier 600 is capable of boosting the differential output voltage $V_o$ (i.e., provide a voltage boost) in either the negative polarity or the positive polarity, as shown when $\|M_{dm}\|>1$ in FIG. 8.

If D=0.5 and $\overline{D}$=0.5, the individual output voltages $V_{o1}$ and $V_{o2}$ are the same, and the differential output voltage $V_o$ is zero. This is the nominal operating condition of the differential boost amplifier 600 for zero input and zero output. As shown in FIG. 8, if D=0.5, the common-mode DC conversion ratio $M_{cm}(D)$ is zero, meaning there is no output voltage present at either output terminal of the two DC/DC converters 620 and 630 (with respect to ground) when the differential output voltage $V_o$ is zero. This represents an idle condition of the differential boost amplifier 600 as there is no output. As this steady-state operating point of the differential boost amplifier 600 is zero, there is no need for a period at startup when the output must slew to establish a new steady-state operating point, thereby making starting and stopping the differential boost amplifier 600 easier and more noise-free.

Figure 9:
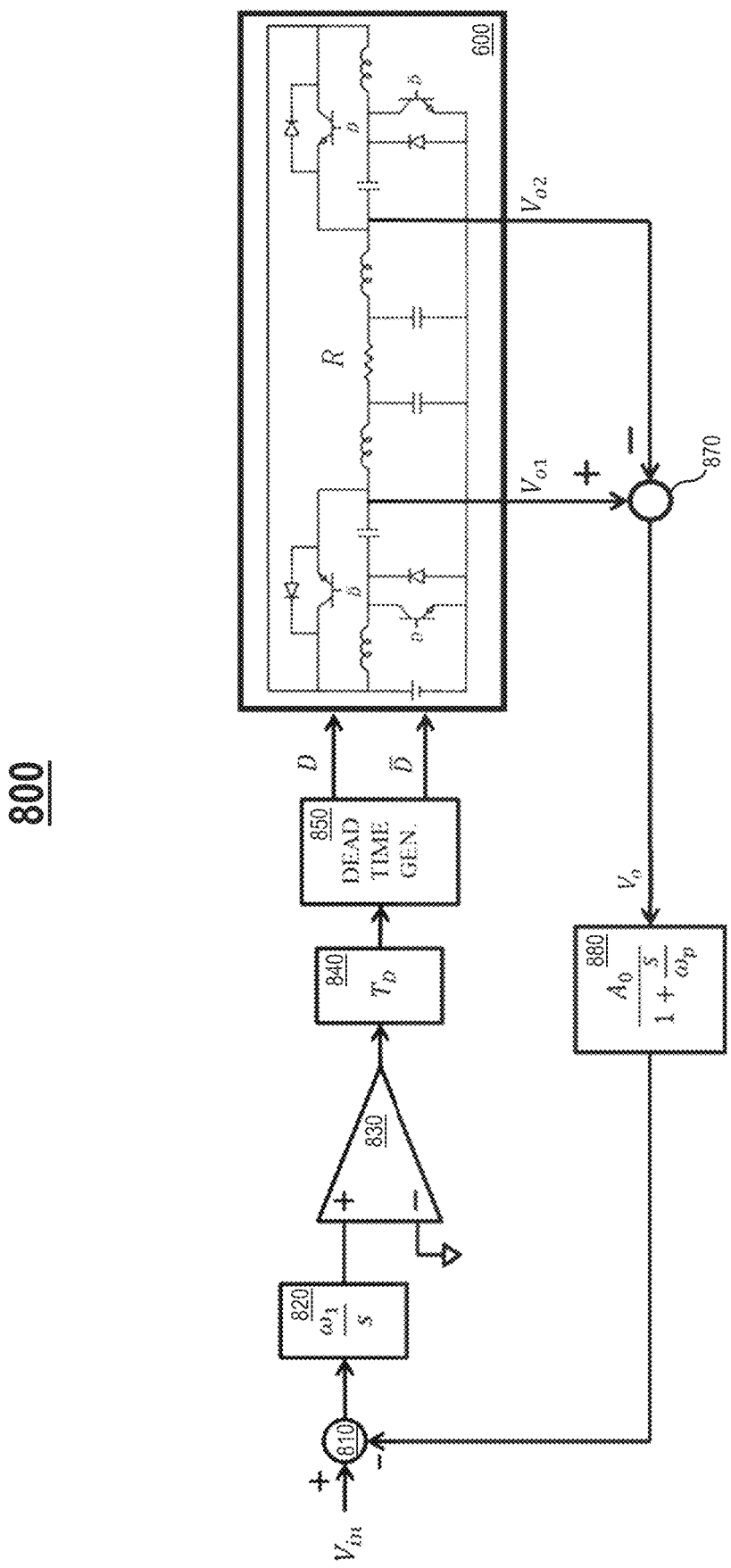
FIG. 9 illustrates an example amplifier system including the differential boost amplifier with feedback control, in accordance with an embodiment.

FIG. 9 illustrates an example amplifier system 800 including a differential boost amplifier 600 with feedback control, in accordance with an embodiment. The system 800 implements feedback control for the differential boost amplifier 600 via a control loop (i.e., controller) configured to control the switches $S_1$ and $\bar{S}_1$ of the first DC/DC converter 620 (FIG. 7) and the switches $S_2$ and $\bar{S}_2$ of the second DC/DC converter 630 (FIG. 7). In one embodiment, the control loop of the system 800 includes at least one of the following: (1) an input summing unit 810, (2) an integrator unit 820, (3) a comparator unit 830, (4) a time-delay unit 840, (5) a dead-time generator unit 850, (6) a differential output summing unit 870, and (7) a feedback processing unit 880.

In one embodiment, the input summing unit 810 is configured to: (1) receive an input signal (e.g., an input audio signal) with an input voltage $V_{in}$, (2) subtract from the input signal a scaled version (i.e., scaled by a scale factor $A_0$) of an output voltage $V_o$ (e.g., from the feedback processing unit 880), and (3) generate an error signal as output to feed to the integrator unit 820, wherein the error signal represents a difference between the input voltage $V_{in}$ and the scaled version of the output voltage $V_o$.

In one embodiment, the integrator unit 820 is configured to: (1) receive an error signal (e.g., an error signal representing a difference between an input voltage $V_{in}$ and a scaled version of an output voltage $V_o$ from the input summing unit 810), (2) integrate the error signal with respect to time, and (3) feed the time-integrated error signal to the comparator unit 830.

In one embodiment, the comparator unit 830 is configured to: (1) receive an input voltage at its positive input terminal (e.g., a time-integrated error signal from the integrator unit 820), (2) compare the input voltage at its positive input terminal against a reference voltage at its negative input terminal (e.g., circuit ground), and (3) produce a digital output signal based on the comparison (e.g., logic high if the input voltage at its positive input terminal is greater than the reference voltage at its negative input terminal, and logic low if the input voltage at its positive input terminal is less than the reference voltage at its negative input terminal).

In one embodiment, the time-delay unit 840 is configured to: (1) receive an input signal (e.g., a digital output signal from the comparator unit 830), and (2) implement a short time-delay of the input signal for a predetermined amount of time $T_D$ (e.g., a small delay, such as 20 ns). The time-delay prevents switching of the power switches at the instant inputs to the comparator unit 830 cross over, thereby enhancing immunity of the system 800 to switching noise. The time-delay also introduces a phase-lag into the control loop as part of the control of the switching frequency.

In one embodiment, the dead-time generator unit 850 is configured to: (1) receive an input signal (e.g., an output signal from the time-delay unit 840), and (2) implement a dead-time period for the DC/DC converters 620 and 630 (i.e., a period when both active switches of each DC/DC converter 620, 630 are off) by (2a) generating, based on the input signal, drive signals for each of the switches $S_1$ and $\bar{S}_1$ corresponding to a duty ratio D and a complementary duty ratio $\overline{D}$, respectively, for use in driving the first DC/DC converter 620, and (2b) further generating, based on the input signal, drive signals for each of the switches $S_2$ and $\bar{S}_2$ corresponding to the complementary duty ratio $\overline{D}$ and the duty ratio D, respectively, for use in driving the second DC/DC converter 630.

In one embodiment, the differential boost amplifier 600 is configured to: (1) receive drive signals for each of the switches $S_1$ and $\bar{S}_1$ corresponding to a duty ratio D and a complementary duty ratio $\overline{D}$, respectively (e.g., from the dead-time generator unit 850), (2) receive drive signals for each of the switches $S_2$ and $\bar{S}_2$ corresponding to the complementary duty ratio $\overline{D}$ and the duty ratio D, respectively (e.g., from the dead-time generator unit 850), (3) generate an individual output voltage $V_{o1}$ by driving (i.e., turning on/off) the first switch $S_1$ and the second switch $\bar{S}_1$ of the first DC/DC converter 620 based on the duty ratio D and the complementary duty ratio $\overline{D}$, respectively, and (4) generate an individual output voltage $V_{o2}$ by driving (i.e., turning on/off) the first switch $S_2$ and the second switch $\bar{S}_2$ of the second DC/DC converter 630 based on the complementary duty ratio $\overline{D}$ and the duty ratio D, respectively.

In one embodiment, the system 800 measures/senses the output voltage $V_{o1}$ before a low-pass LC filter of the first DC/DC converter 620, and provides the output voltage $V_{o1}$ measured/sensed to the differential output summing unit 870. In another embodiment, the system 800 measures/senses the output voltage $V_{o1}$ after the low-pass LC filter of the first DC/DC converter 620, taking into account an additional phase-lag introduced by the low-pass LC filter in a self-oscillating design of the control loop.

In one embodiment, the system 800 measures/senses the output voltage $V_{o2}$ before a low-pass LC filter of the second DC/DC converter 630, and provides the output voltage $V_{o2}$ measured/sensed to the differential output summing unit 870. In another embodiment, the system 800 measures/senses the output voltage $V_{o2}$ after the low-pass LC filter of the second DC/DC converter 630, taking into account an additional phase-lag introduced by the low-pass LC filter in a self-oscillating design of the control loop. In another embodiment, the low-pass LC filter may be omitted entirely, utilizing the low-pass properties of a loudspeaker driver to filter out the switching frequency components.

In one embodiment, the differential output summing unit 870 is configured to: (1) receive a first individual output voltage $V_{o1}$ (e.g., from the differential boost amplifier 600), (2) receive a second individual output voltage $V_{o2}$ (e.g., from the differential boost amplifier 600), and (3) generate a differential output voltage $V_0$ with an instantaneous output voltage level based on the first individual output voltage $V_{o1}$ and the second individual output voltage $V_{o2}$ (e.g., generate the differential output voltage $V_o$ in accordance with equation (2) provided above). A loudspeaker device (e.g., loudspeaker device 1340 in FIG. 14) connected to the boost amplifier 600 is driven by the differential output voltage $V_o$. The system 800 provides the differential output voltage $V_o$ as an output voltage feedback signal to the feedback processing unit 880.

In one embodiment, the feedback processing unit 880 is configured to: (1) receive an output voltage feedback signal (e.g., from the differential output summing unit 870), (2) scale the output voltage feedback signal by a (positive or negative) scale factor $A_o$, and (3) apply a low-pass filter to suppress the switching frequency and its harmonics in the output voltage feedback signal. The gain of the boost amplifier 600 is calculated from the scale factor $A_o$, wherein the gain approaches $1/A_o$ (e.g., a scale factor $A_o$ of 0.1 yields an amplifier gain approaching 10). A pole of the low-pass filter $\omega_p$ is chosen to attenuate the switching frequency and its harmonics in the output voltage feedback signal, and contributes to the phase-lag that determines the switching frequency in a self-oscillating design. The differential boost amplifier 600 amplifies an input signal with an input voltage $V_{in}$ to the system 800 based on the gain.

The system 800 is a complete self-oscillating differential boost amplifier. In one embodiment, the control loop of the system 800 is designed as an asynchronous modulator, where switching frequencies of the switches $S_1$, $\bar{S}_1$, $S_2$, and $\bar{S}_2$ are variable and based on the gain and phase of the control loop. This design provides a large low-frequency loop gain and allows the differential boost amplifier 600 to oscillate at a desired switching frequency, typically well above a desired bandwidth. The large low-frequency loop gain provides high performance in terms of distortion rejection and low output impedance. In another embodiment, the control loop of the system 800 is designed based on one or more other strategies, such as, but not limited to, hysteresis control, open loop control, fixed-frequency PWM control, etc.

The differential boost amplifier 600 simultaneously boosts the output voltage $V_o$ and amplifies the input signal to the system 800.

Figure 10:
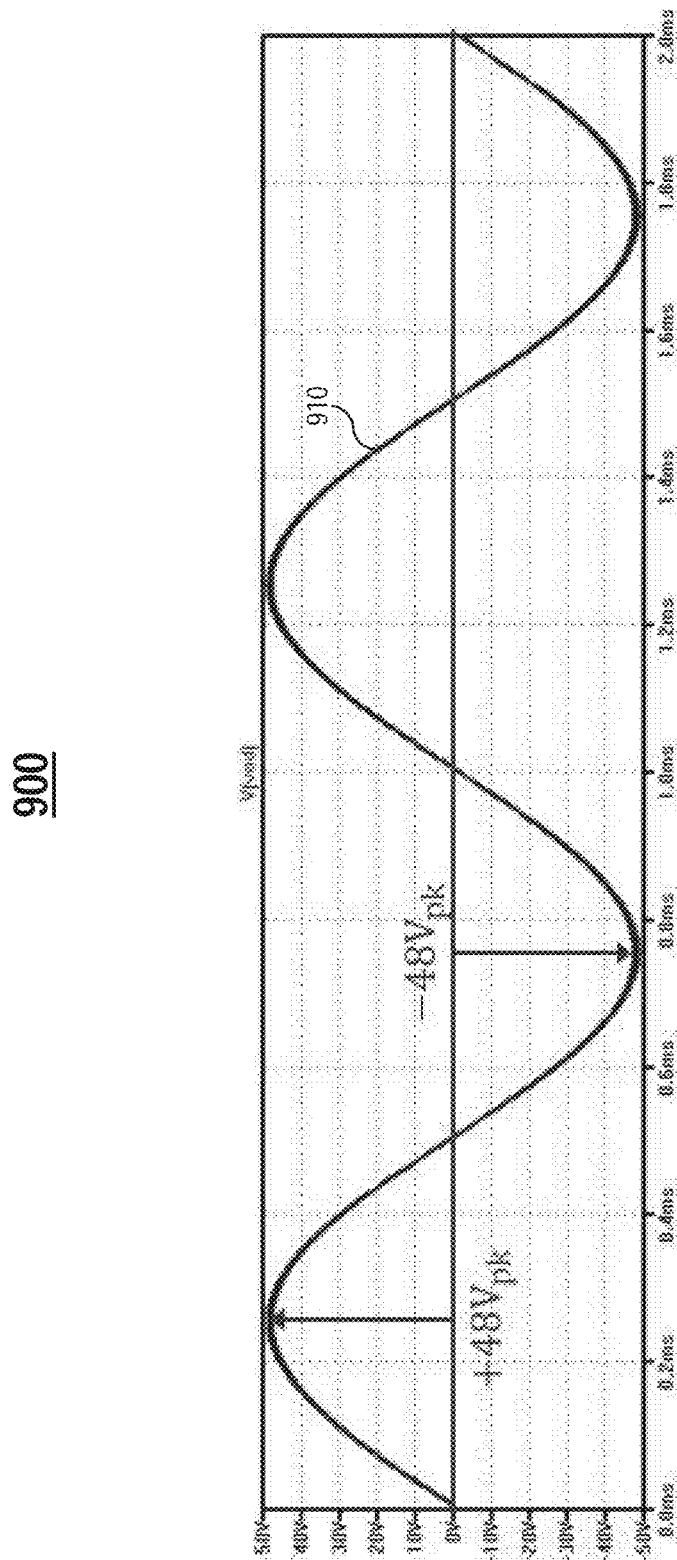
FIG. 10 is an example graph illustrating sinusoidal output voltage generated by the differential boost amplifier, in accordance with an embodiment.

FIG. 10 is an example graph 900 illustrating sinusoidal output voltage $V_o$ generated by a differential boost amplifier 600, in accordance with an embodiment. A horizontal axis of the graph 900 represents time in ms. A vertical axis of the graph 900 represents a magnitude of the output voltage $V_o$ in V. Assume the differential boost amplifier 600 is operated from a single DC voltage source supplying a supply voltage $V_g$ of 20V. The graph 900 comprises a curve 910 representing the output voltage $V_o$ with 1 kHz sinusoidal input.

As shown in FIG. 10, the differential boost amplifier 600 is capable of generating positive output, negative output, and zero output. The differential boost amplifier 600 is capable of boosting the output voltage $V_o$ in both polarities (i.e., the negative polarity and the positive polarity). As shown in FIG. 10, the differential boost amplifier 600 is capable of producing peak output voltages of ±48V. The differential boost amplifier 600 delivers peak output voltages that exceed the supply voltage $V_g$ of 20V. The differential boost amplifier 600 reduces audio distortion even when driving a loudspeaker at extreme levels.

Figure 11:
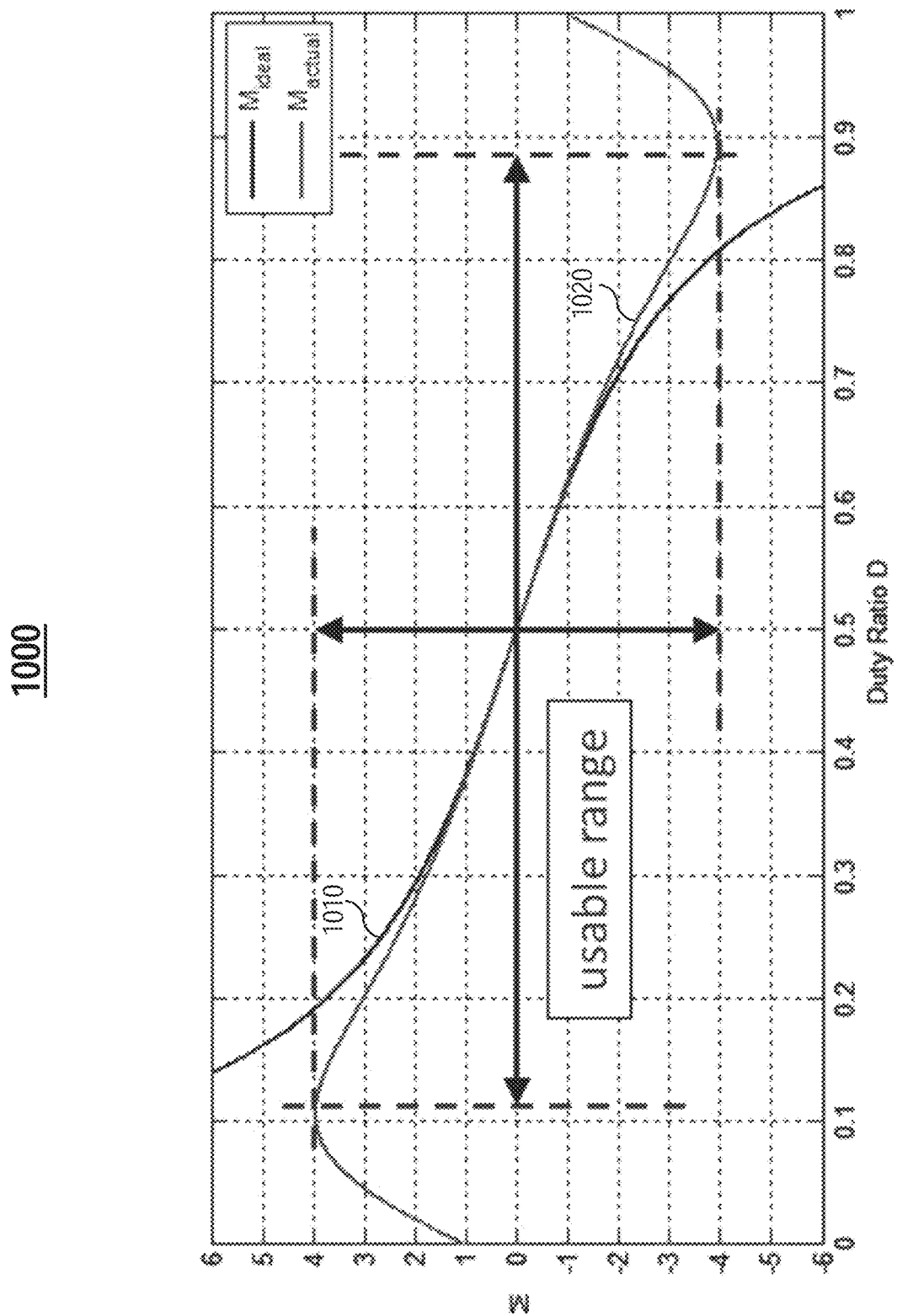
FIG. 11 is an example graph comparing an ideal DC conversion ratio of the differential boost amplifier against an actual DC conversion ratio of the differential boost amplifier, in accordance with an embodiment.

FIG. 11 is an example graph 1000 comparing an ideal DC conversion ratio $M_{ideal}(D)$ of a differential boost amplifier 600 against an actual DC conversion ratio $M_{actual}(D)$ of the differential boost amplifier 600, in accordance with an embodiment. A horizontal axis of the graph 1000 represents a duty ratio D, wherein $0 \leq D \leq 1$. A vertical axis of the graph 1000 represents a DC conversion ratio M. The ideal DC conversion ratio $M_{ideal}(D)$ represents a DC conversion ratio of the differential boost amplifier 600 (driven based on the duty ratio D) based on the equations (1), (2), and (3) provided above. The actual DC conversion ratio $M_{actual}(D)$ represents a DC conversion ratio of the differential boost amplifier 600 (driven based on the duty ratio D) in practice. The actual DC conversion ratio $M_{actual}(D)$ is limited by various factors, such as the finite resistances of the switches, the non-zero dead-time, and losses in the passive components. The graph 1000 comprises: (1) a first curve 1010 representing the ideal DC conversion ratio $M_{ideal}(D)$, and (2) a second curve 1020 representing the actual DC conversion ratio $M_{actual}(D)$.

As shown in FIG. 11, the ideal DC conversion ratio $M_{ideal}(D)$ extends to +∞, whereas the actual DC conversion ratio $M_{actual}(D)$ is limited to approximately ±4 (i.e., a usable range). As shown in FIG. 11, for extreme values of the duty ratio D (i.e., outside the usable range), the slope of the second curve 1020 (representing the actual DC conversion ratio $M_{actual}(D)$) reverses. Unlike the ideal DC conversion ratio $M_{ideal}(D)$, extending the duty ratio D to these extreme values reduces, rather than increases, a magnitude of an output voltage $V_o$ generated by the differential boost amplifier 600. In practice, this can cause the differential boost amplifier 600 to be unstable, or worse, can lead to failure from excessive currents in real components. To avoid this, the duty ratio D can be limited to the usable range where the actual DC conversion ratio $M_{actual}(D)$ is monotonic, and component stresses are within ratings.

Figure 12:
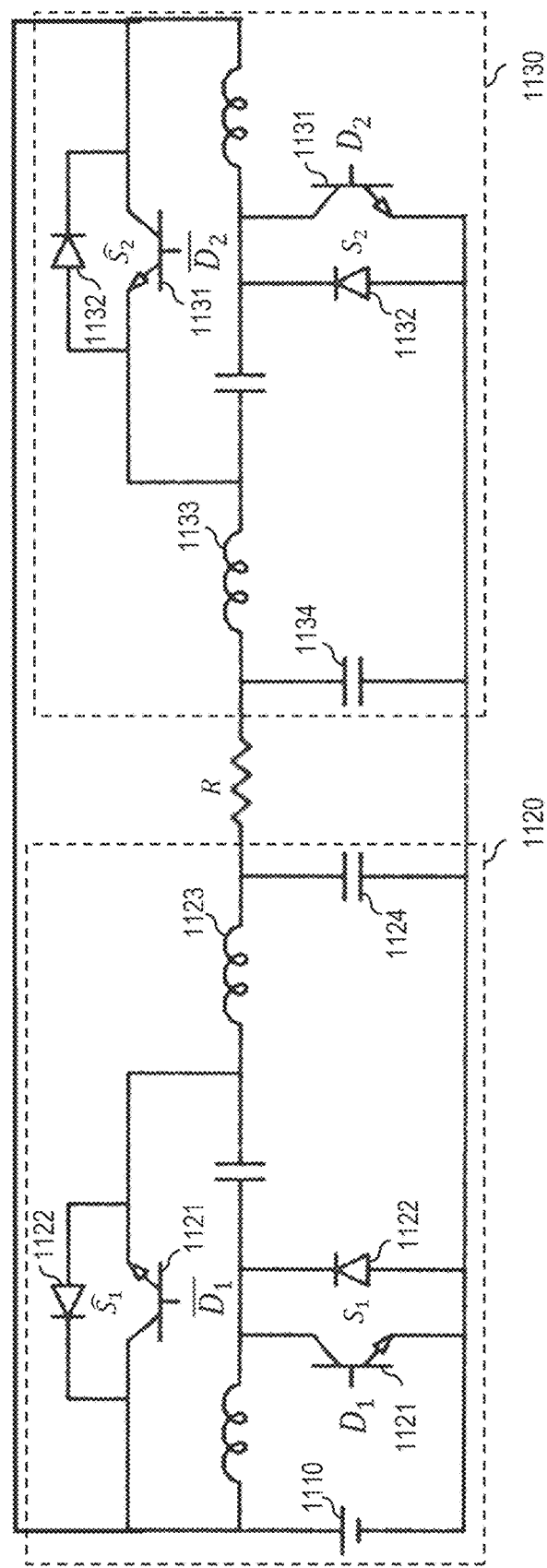
FIG. 12 illustrates another example differential boost amplifier, in accordance with an embodiment.

FIG. 12 illustrates another example differential boost amplifier 1100, in accordance with an embodiment. The differential boost amplifier 1100 comprises two DC/DC converters, i.e., a first DC/DC converter 1120 and a second DC/DC converter 1130. Each DC/DC converter 1120, 1130 is arranged in accordance with the topology of the DC/DC converter 100 (FIG. 1). The two DC/DC converters 1120 and 1130 are operated by a single DC voltage source 1110. The voltage source 1110 is configured to supply the two DC/DC converters 1120 and 1130 with a DC supply voltage (i.e., source voltage) $V_g$. An output load R is connected across output terminals of the two DC/DC converters 1120 and 1130 with a common ground (not shown).

As shown in FIG. 12, each DC/DC converter 1120, 1130 comprises two switches. Specifically, the first DC/DC converter 1120 comprises a first switch $S_1$ and a second switch $\bar{S}_1$, wherein the second switch $\bar{S}_1$ is driven complementary to the first switch $S_1$. The second DC/DC converter 1130 comprises a first switch $S_2$ and a second switch $\bar{S}_2$, wherein the second switch $\bar{S}_2$ is driven complementary to the first switch $S_2$.

In one embodiment, each switch $S_1$, $\bar{S}_1$, $S_2$, and $\bar{S}_2$ comprises an active switch and a passive switch in parallel. For example, as shown in FIG. 12, each switch $S_1$, $\bar{S}_1$ is a transistor-diode pair including a transistor 1121 (as active switch) and a diode 1122 (as passive switch) in parallel, and each switch $S_2$, $\bar{S}_2$ is a transistor-diode pair including a transistor 1131 (as active switch) and a diode 1132 (as passive switch) in parallel.

In one embodiment, each DC/DC converter 1120, 1130 has an individual duty ratio and is driven based on the individual duty ratio. For example, as shown in FIG. 12, the first DC/DC converter 1120 and the second DC/DC converter 1130 are driven based on a first duty ratio $D_1$ and a second duty ratio $D_2$, respectively.

The first DC/DC converter 1120 is configured to generate an individual output voltage $V_{o1}$ by driving (i.e., turning on/off) the first switch $S_1$ and the second switch $\bar{S}_1$ based on the duty ratio $D_1$ and the complementary duty ratio $\overline{D_1}$, respectively. The first DC/DC converter 1120 comprises a low-pass LC filter that includes, at each output terminal, an inductor 1123 and a capacitor 1124 connected together.

The second DC/DC converter 1130 is configured to generate an individual output voltage $V_{o2}$ by driving (i.e., turning on/off) the first switch $S_2$ and the second switch $\bar{S}_2$ based on the duty ratio $D_2$ and the complementary duty ratio $\overline{D}_2$, respectively. The second DC/DC converter 1130 comprises a low-pass LC filter that includes, at each output terminal, an inductor 1133 and a capacitor 1134 connected together.

The differential boost amplifier 1100 is configured to provide power amplification of an input signal (e.g., an input audio signal) based on a differential connection of the two DC/DC converters 1120 and 1130. Specifically, the differential boost amplifier 1100 is configured to generate an output voltage $V_o$ that is the differential output voltage measured across the output terminals of the two DC/DC converters 1120 and 1130.

Utilizing the individual duty ratios $D_1$ and $D_2$ allows independent control of each DC/DC converter 1120, 1130, and extends regulation of the output voltage $V_o$ even when one of the DC/DC converters has reached a pre-determined maximum limit (i.e., threshold) corresponding to its individual duty ratio. For example, if an individual duty ratio of one of the DC/DC converters reaches a corresponding pre-determined maximum duty ratio (e.g., $D_{max}$), the other DC/DC converter can continue to regulate the output voltage $V_o$.

Figure 13:
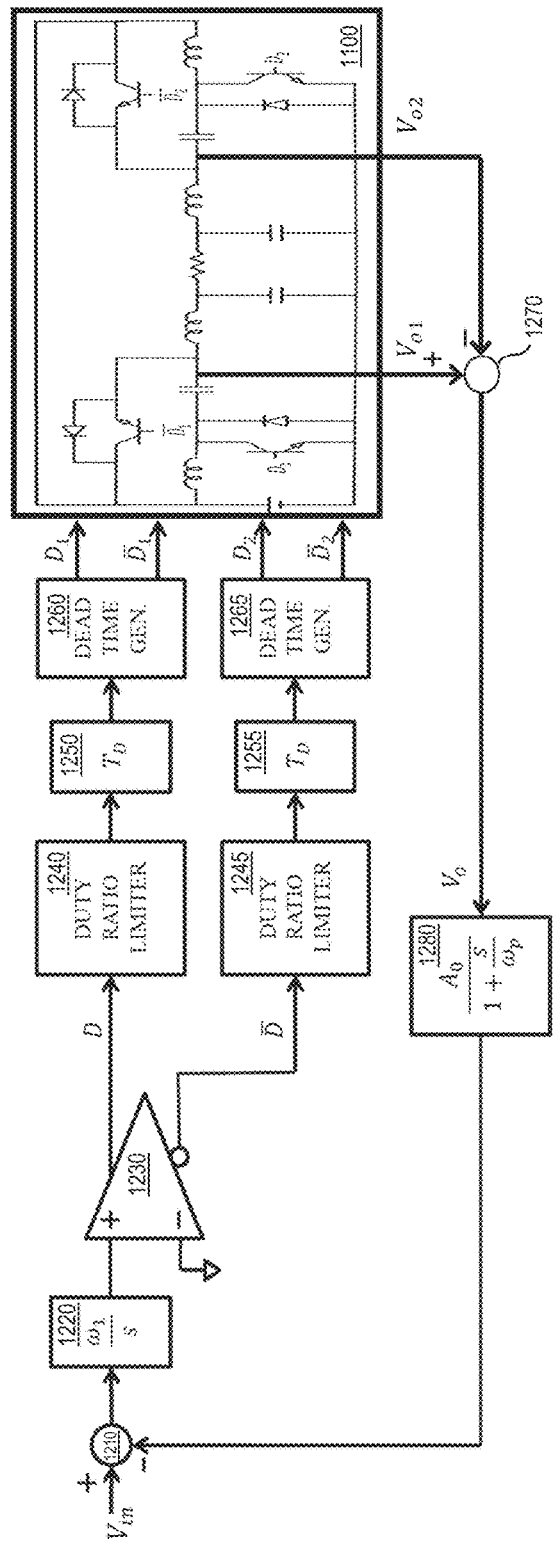
FIG. 13 illustrates an example amplifier system including the differential boost amplifier in FIG. 12 with feedback control, in accordance with an embodiment.

FIG. 13 illustrates an example amplifier system 1200 including a differential boost amplifier 1100 with feedback control, in accordance with an embodiment. The system 1200 implements feedback control for the differential boost amplifier 1100 via a control loop (i.e., controller) configured to control the switches $S_1$ and $\bar{S}_1$ of the first DC/DC converter 1120 and the switches $S_2$ and $\bar{S}_2$ of the second DC/DC converter 1130. In one embodiment, the control loop of the system 1200 includes at least one of the following: (1) an input summing unit 1210, (2) an integrator unit 1220, (3) a comparator unit 1230, (4) a first duty ratio limiter unit 1240, (5) a second duty ratio limiter unit 1245, (6) a first time-delay unit 1250, (7) a second time-delay unit 1255, (8) a first dead-time generator unit 1260, (9) a second dead-time generator unit 1265, (10) a differential output summing unit 1270, and (11) a feedback processing unit 1280.

In one embodiment, the input summing unit 1210 is configured to: (1) receive an input signal (e.g., an input audio signal) with an input voltage $V_{in}$, (2) subtract from the input signal a scaled version (i.e., scaled by a scale factor $A_0$) of the output voltage $V_o$ (e.g., from the feedback processing unit 1280), and (3) generate an error signal as output to feed to the integrator unit 1220, wherein the error signal represents a difference between the input voltage $V_{in}$ and the scaled version of the output voltage $V_o$.

In one embodiment, the integrator unit 1220 is configured to: (1) receive an error signal (e.g., an error signal representing a difference between an input voltage $V_{in}$ and a scaled version of an output voltage $V_o$ from the input summing unit 1210), (2) integrate the error signal with respect to time, and (3) feed the time-integrated error signal to the comparator unit 1230.

In one embodiment, the comparator unit 1230 is configured to: (1) receive an input voltage at its positive input terminal (e.g., a time-integrated error signal from the integrator unit 1220), (2) compare the input voltage at its positive input terminal against a reference voltage at its negative input terminal (e.g., circuit ground), (3) at its non-inverting output, produce a first digital output signal based on the comparison (e.g., logic high if the input voltage at its positive input terminal is greater than the reference voltage at its negative input terminal, and logic low if the input voltage at its positive input terminal is less than the reference voltage at its negative input terminal), and (4) at its inverting output, produce a second digital output signal based on the comparison (i.e., logic low if the input voltage at its positive input terminal is greater than the reference voltage at its negative input terminal, and logic high if the input voltage at its positive input terminal is less than the reference voltage at its negative input terminal).

In one embodiment, the system 1200 comprises a Class-D modulator. For example, in one embodiment, the Class-D modulator comprises the duty ratio limiters 1240 and 1245. Each duty ratio limiter unit 1240, 1245 is configured to: (1) receive an input signal (e.g., from the comparator unit 1230), and (2) implement a limit on a duty ratio of its output signal, resulting in an output signal with a limited duty ratio, wherein the limited duty ratio can extend to zero but cannot exceed a pre-determined maximum duty ratio (e.g., $D_{max}$), thereby limiting operation within a usable range of the amplifier. For example, as shown in FIG. 13, the first duty ratio limiter unit 1240 and the second duty ratio limiter unit 1245 receive a first input signal with a first duty ratio D and a second input signal with a second duty ratio $\overline{D}$, respectively, from the comparator unit 1230. If, in operation, the first duty ratio D from the comparator unit 1230 exceeds a pre-determined maximum duty ratio $D_{max}$, then the output of the first duty ratio limiter 1240 is a signal with the maximum duty ratio $D_{max}$. Similarly, in operation, if the second duty ratio D from the comparator unit 1230 exceeds a pre-determined maximum duty ratio $\overline{D}_{max}$, then the output of the second duty ratio limiter 1245 is a signal with the maximum duty ratio $\overline{D}_{max}$.

In one embodiment, each time-delay unit 1250, 1255 is configured to: (1) receive an input signal (e.g., a digital output signal from the duty ratio limiter unit 1240, 1245, respectively), and (2) implement a short time-delay of the input signal for a predetermined amount of time $T_D$ (e.g., a small delay, such as 20 ns). The time-delay prevents switching of the power switches at the instant inputs to the comparator unit 1230 cross over, thereby enhancing immunity of the system 1200 to switching noise. The time-delay also introduces a phase-lag into the control loop as part of the control of the switching frequency.

In one embodiment, the first dead-time generator unit 1260 is configured to: (1) receive an input signal (e.g., an output signal from the first time-delay unit 1250), and (2) implement a dead-time period for the first DC/DC converter 1120 (i.e., a period when both active switches of the first DC/DC converter 1120 are off) by generating, based on the input signal, drive signals for each of the switches $S_1$ and $\bar{S}_1$ corresponding to a duty ratio $D_1$ and a complementary duty ratio $\overline{D}_1$, respectively, for use in driving the first DC/DC converter 1120.

In one embodiment, the second dead-time generator unit 1265 is configured to: (1) receive an input signal (e.g., an output signal from the second time-delay unit 1255), and (2) implement a dead-time period for the second DC/DC converter 1130 (i.e., a period when both switches of the second DC/DC converter 1130 are off) by generating, based on the input voltage, drive signals for each of the switches $S_2$ and $\bar{S}_2$ corresponding to a duty ratio $D_2$ and a complementary duty ratio $\overline{D}_2$, respectively, for use in driving the second DC/DC converter 1130.

In one embodiment, the differential boost amplifier 1100 is configured to: (1) receive drive signals for each of the switches $S_1$ and $\bar{S}_2$ corresponding to a duty ratio $D_1$ and a complementary duty ratio $\overline{D_1}$, respectively (e.g., from the first dead-time generator unit 1260), (2) receive drive signals for each of the switches $S_2$ and $\bar{S}_2$ corresponding to a duty ratio $D_2$ and a complementary duty ratio $\overline{D_2}$, respectively (e.g., from the second dead-time generator unit 1265), (3) generate an individual output voltage $V_{o1}$ by driving (i.e., turning on/off) the first switch $S_1$ and the second switch $\bar{S}_2$ of the first DC/DC converter 1120 based on the duty ratio $D_1$ and the complementary duty ratio $\overline{D_1}$, respectively, and (4) generate an individual output voltage $V_{o2}$ by driving (i.e., turning on/off) the first switch $S_2$ and the second switch $\bar{S}_2$ of the second DC/DC converter 1130 based on the duty ratio $D_2$ and the complementary duty ratio $\overline{D_2}$, respectively.

In one embodiment, the system 1200 measures/senses the output voltage $V_{o1}$ before a low-pass LC filter of the first DC/DC converter 1120, and provides the output voltage $V_{o1}$ measured/sensed to the differential output summing unit 1270. In another embodiment, the system 1200 measures/senses the output voltage $V_{o1}$ after the low-pass LC filter of the first DC/DC converter 1120, taking into account an additional phase-lag introduced by the low-pass LC filter in a self-oscillating design of the control loop.

In one embodiment, the system 1200 measures/senses the output voltage $V_{o2}$ before a low-pass LC filter of the second DC/DC converter 1130, and provides the output voltage $V_{o2}$ measured/sensed to the differential output summing unit 1270. In another embodiment, the system 1200 measures/senses the output voltage $V_{o2}$ after the low-pass LC filter of the second DC/DC converter 1130, taking into account an additional phase-lag introduced by the low-pass LC filter in a self-oscillating design of the control loop. In another embodiment, the low-pass LC filter may be omitted entirely, utilizing the low-pass properties of a loudspeaker driver to filter out the switching frequency components.

In one embodiment, the differential output summing unit 1270 is configured to: (1) receive a first individual output voltage $V_{o1}$ (e.g., from the differential boost amplifier 1100), (2) receive a second individual output voltage $V_{o2}$ (e.g., from the differential boost amplifier 1100), and (3) generate a differential output voltage $V_o$ with an instantaneous output voltage level based on the first individual output voltage $V_{o1}$ and the second individual output voltage $V_{o2}$ (e.g., generate the differential output voltage $V_o$ in accordance with equation (2) provided above). A loudspeaker device (e.g., loudspeaker device 1340 in FIG. 14) connected to the boost amplifier 1100 is driven by the output voltage $V_o$. The system 1200 provides the differential output voltage $V_o$ as an output voltage feedback signal to the feedback processing unit 1280.

In one embodiment, the feedback processing unit 1280 is configured to: (1) receive an output voltage feedback signal (e.g., from the differential output summing unit 1270), (2) scale the output voltage feedback signal by a (positive or negative) scale factor $A_o$, and (3) apply a low-pass filter to suppress the switching frequency and its harmonics in the output voltage feedback signal. The gain of the boost amplifier 1100 is calculated from scale factor $A_o$, wherein the gain approaches $1/A_0$ (e.g., a scale factor $A_o$ of 0.1 yields an amplifier gain approaching 10). A pole of the low-pass filter $\omega_p$ is chosen to attenuate the switching frequency and its harmonics in the output voltage feedback signal, and contributes to the phase-lag that determines the switching frequency in a self-oscillating design. The differential boost amplifier 1100 amplifies an input signal with an input voltage $V_{in}$ to the system 1200 based on the gain.

Utilizing the duty ratio limiter units 1240 and 1245 and the individual duty ratios $D_1$ and $D_2$ allows for independent control of each DC/DC converter 1120, 1130, and extends regulation of the output voltage $V_o$. In this way, if the first DC/DC converter 1120 reaches a pre-determined maximum duty ratio corresponding to its individual duty ratio $D_1$, the second DC/DC converter 1130 is still regulating the output voltage $V_o$. Similarly, if the second DC/DC converter 1120 reaches a pre-determined maximum duty ratio corresponding to its individual duty ratio $D_2$ instead, the first DC/DC converter 1120 is still regulating the output voltage $V_o$. This permits the widest usable range of the output voltage $V_o$.

Utilizing the individual duty ratios $D_1$ and $D_2$ allows independent control of each DC/DC converter 1120, 1130, and extends regulation of the output voltage $V_o$ even when one of the DC/DC converters has reached a pre-determined maximum limit (i.e., threshold) corresponding to its individual duty ratio. For example, if an individual duty ratio of one of the DC/DC converters reaches a corresponding pre-determined maximum duty ratio $D_{max}$, the other DC/DC converter can continue to regulate the output voltage $V_o$.

The system 1200 is a complete self-oscillating differential boost amplifier. In one embodiment, the control loop of the system 1200 is designed as an asynchronous modulator, where switching frequencies of the switches $S_1$, $\bar{S}_1$, $S_2$, and $\bar{S}_2$ are variable and based on gain and phase of the control loop. This design provides a large low-frequency loop gain and allows the differential boost amplifier 1100 to oscillate at a desired switching frequency, typically well above a desired bandwidth. The large low-frequency loop gain provides high performance in terms of distortion rejection and low output impedance. In another embodiment, the control loop of the system 1200 is designed based on one or more other strategies, such as, but not limited to, hysteresis control, open loop control, fixed-frequency PWM control, etc.

The differential boost amplifier 1100 simultaneously boosts the output voltage $V_o$ and amplifies the input signal to the system 1200.

Figure 14:
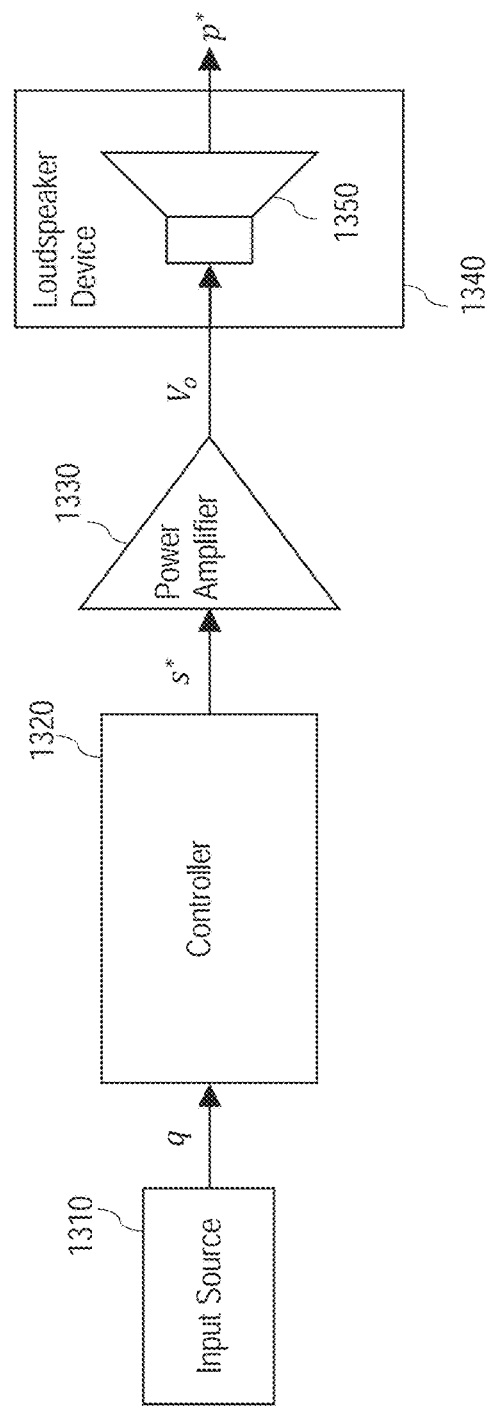
FIG. 14 illustrates an example loudspeaker control system, in accordance with an embodiment.

FIG. 14 illustrates an example loudspeaker control system 1300, in accordance with an embodiment. The loudspeaker control system 1300 is an example nonlinear control system for a loudspeaker device 1340 driven by a power amplifier 1330. In one embodiment, the power amplifier 1330 is implemented as one of the following: a single-ended boost amplifier (e.g., single-ended boost amplifier 360 in FIG. 3 or single-ended boost amplifier 500 in FIG. 5), or a differential boost amplifier (e.g., differential boost amplifier 600 in FIG. 7 or differential boost amplifier 1100 in FIG. 12).

Specifically, the loudspeaker control system 1300 comprises the loudspeaker device 1340 including a speaker driver 1350 for reproducing sound. In one embodiment, the loudspeaker device 1340 is a sealed-box loudspeaker. In another embodiment, the loudspeaker device 1340 is another type of loudspeaker such as, but not limited to, a vented box loudspeaker, a passive radiator loudspeaker, a loudspeaker array, a transmission line loudspeaker, a headphone, an earbud, etc.

The speaker driver 1350 is any type of electro-dynamic speaker driver such as, but not limited to, a moving coil speaker driver, a moving magnet speaker driver, a compression speaker driver, a forward-facing speaker driver, an upward-facing speaker driver, a downward-facing speaker driver, etc.

In one embodiment, the loudspeaker control system 1300 comprises a controller 1320 configured to receive a source signal q (e.g., an input audio signal) from an input source 1310, and control reproduction of the source signal q via the loudspeaker device 1340 to produce a desired audio output. In one embodiment, the desired audio output comprises, at any sampling time (i.e., instant) t, a target (i.e., desired) sound pressure p* of a target sound wave for the loudspeaker device 1340 to produce at the sampling time t during the reproduction of the source signal q. In one embodiment, the loudspeaker control system 1300 is configured to determine the target sound pressure p* from the source signal q.

In one embodiment, the controller 1320 is configured to receive a source signal q from different types of input sources 1310. Examples of different types of input sources 1310 include, but are not limited to, a mobile electronic device (e.g., a smartphone, a laptop, a tablet, etc.), a content playback device (e.g., a television, a radio, a computer, a music player such as a CD player, a video player such as a DVD player, a turntable, etc.), or an audio receiver, etc.

In one embodiment, the controller 1320 is configured for nonlinear control of the loudspeaker device 1340 to correct for audio distortion-inducing nonlinear effects encountered while driving the loudspeaker device 1340. For example, in one embodiment, to reduce or minimize audio distortion in audio output produced by the loudspeaker device 1340, the controller 1320 is configured to determine, at any sampling time t, based on a physical model of the loudspeaker device 1340 and the desired audio output, at least one of the following: (1) a target displacement (e.g., target cone displacement) x* of the one or more moving components (e.g., diaphragm, driver voice coil, former, and/or protective cap) of the speaker driver 1350 at the sampling time t, (2) a target current i* that produces the target displacement x* at the sampling time t, and (3) a target voltage v* that produces the target displacement x* at the sampling time t.

In one embodiment, the controller 1320 is configured to generate and transmit, at any sampling time t, a corrected drive signal s* specifying a target voltage v for the sampling time t to the power amplifier 1330 to drive the loudspeaker device 1340. The corrected drive signal s* can be any type of signal such as, but not limited to, a current, a voltage, a digital signal, an analog signal, a differential signal, etc.

A physical model of the loudspeaker device 1340 is based on one or more loudspeaker parameters for the loudspeaker device 1340. In one embodiment, a physical model of the loudspeaker device 1340 utilized by the controller 1320 is a nonlinear model.

As shown in FIG. 14, the power amplifier 1330 is connected to the loudspeaker device 1340 and the controller 1320. In one embodiment, the power amplifier 1330 is a voltage amplifier configured to output (i.e., apply or produce), at any sampling time t, an actual voltage $V_o$ (i.e., applied voltage) based on a corrected drive signal s* received from the controller 1320, wherein the corrected drive signal s specifies a target voltage v* for the sampling time t. The corrected drive signal s* controls the power amplifier 1330, directing the power amplifier 1330 to output an amount of voltage that is substantially the same as the target voltage V. The speaker driver 1350 is driven by the actual voltage $V_o$, thereby controlling an actual displacement of one or more moving components of the speaker driver 1350 during the reproduction of the source signal. Specifically, the loudspeaker control system 1300 controls cone displacement/motion of the one or more moving components based on the target voltage v*, resulting in production of a target sound wave with a target sound pressure p* at the sampling time t.

The loudspeaker control system 1300 facilitates a higher level of audio reproduction, with improved sound quality, and additional control of the loudspeaker device 1340.

In one embodiment, the loudspeaker control system 1300 may be integrated in different types of electrodynamic transducers with a broad range of applications such as, but not limited to, the following: computers, televisions (TVs), smart devices (e.g., smart TVs, smart phones, etc.), soundbars, subwoofers, wireless and portable speakers, mobile phones, headphones, earbuds, car speakers, etc.

The loudspeaker control system 1300 can be employed to reduce material and manufacturing costs associated with speaker drivers in audio systems, obviating the need for shorting-rings or other means to stabilize voice-coil inductance.

Figure 15:
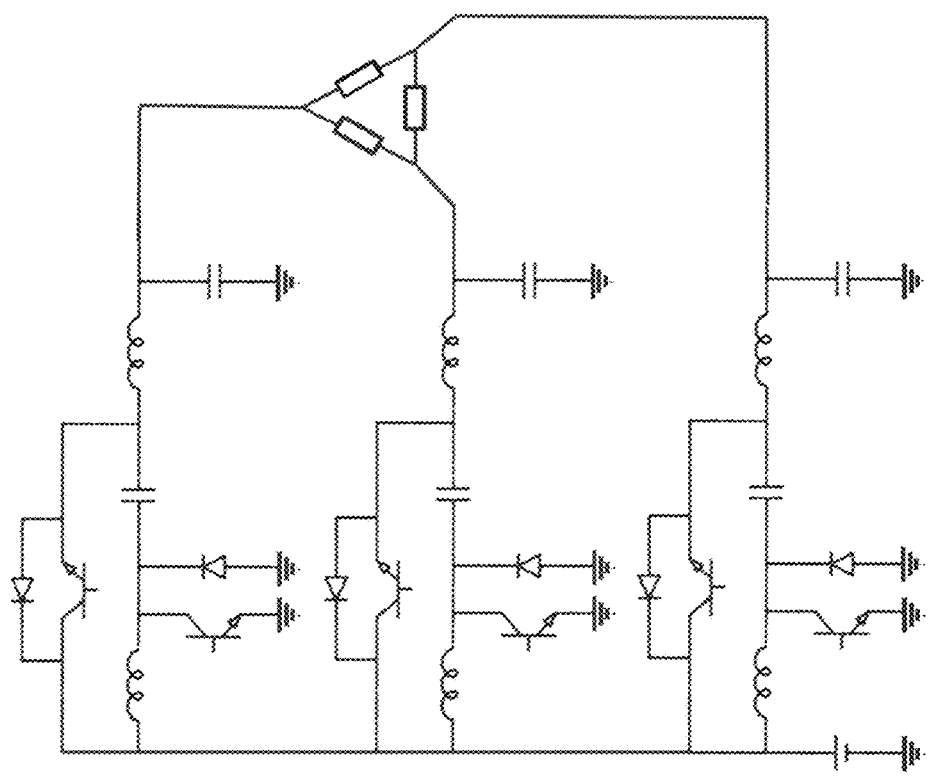
FIG. 15 illustrates an example DC/AC power inverter, in accordance with an embodiment.

FIG. 15 illustrates an example DC/AC power inverter 1400, in accordance with an embodiment. The power inverter 1400 comprises a three-phase inverter driving a three-phase delta-type load (i.e., three wire load). Each phase of the three-phase inverter comprises active switches and passive switches arranged in accordance with the topology of the DC/DC converter 100 (FIG. 1). Each phase of the three-phase inverter is independently controlled and driven based on a corresponding individual duty ratio. The power inverter 1400 is capable of stepping an output voltage $V_o$ up or down with respect to an input voltage. For example, the power inverter 1400 could serve as an interface between a low voltage DC source voltage and a high voltage three-phase load.

Figure 16:
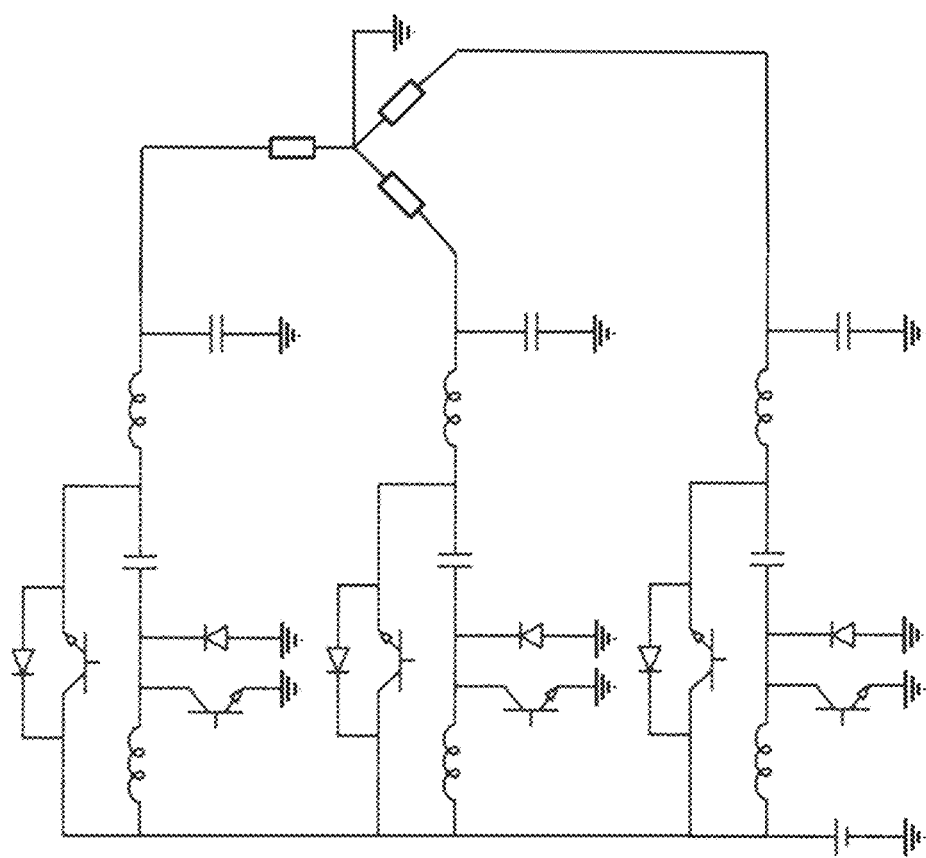
FIG. 16 illustrates another example DC/AC power inverter, in accordance with an embodiment.

FIG. 16 illustrates another example DC/AC power inverter 1500, in accordance with an embodiment. The power inverter 1500 comprises a three-phase inverter driving a three-phase wye-type load with grounded neutral (i.e., four wire load). Each phase of the three-phase inverter comprises active switches and passive switches arranged in accordance with the topology of the DC/DC converter 100 (FIG. 1). Each phase of the three-phase inverter is independently controlled and driven based on a corresponding individual duty ratio. The line-to-neutral voltage is limited to a DC supply voltage $+V_g$ in the positive direction. In the negative direction, the power inverter 1500 is capable of boosting a magnitude of an output voltage beyond $-V_g$.

Figure 17:
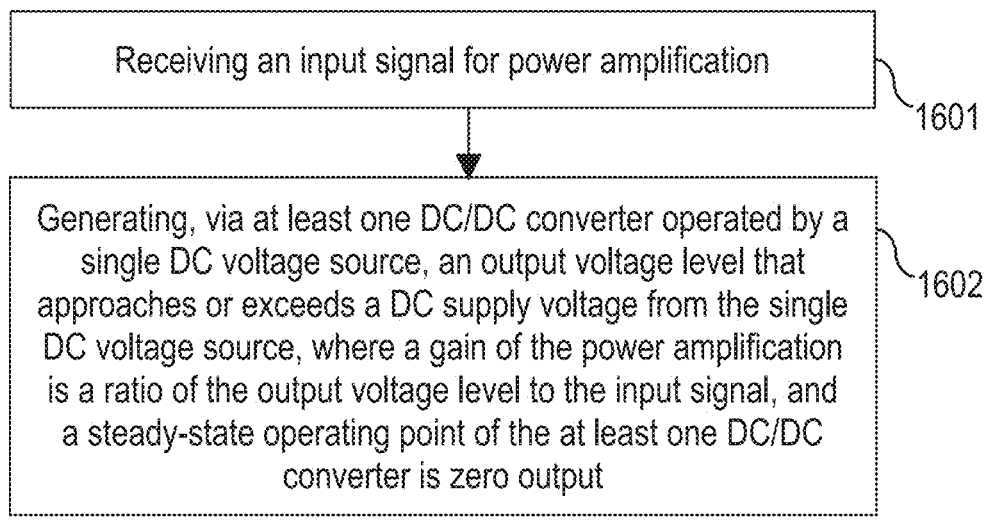
FIG. 17 is an example flowchart of a process for amplifying an input signal, in accordance with an embodiment.

FIG. 17 is an example flowchart of a process 1600 for amplifying an input signal, in accordance with an embodiment. Process block 1601 includes receiving an input signal (e.g., $V_{in}$) for power amplification. Process block 1602 includes generating, via at least one DC/DC converter operated by a single DC voltage source, an output voltage level (e.g., output voltage $V_o$ with an instantaneous output voltage level) that approaches or exceeds a DC supply voltage (e.g., $V_g$) from the single DC voltage source, where a gain of the power amplification is a ratio of the output voltage level to the input signal, and where a steady-state operating point of the at least one DC/DC converter is zero output.

In one embodiment, one or more components of the amplifier system 300, the amplifier system 800, the amplifier system 1200, the single-ended boost amplifier 360, the single-ended boost amplifier 500, the differential boost amplifier 600, and/or the differential boost amplifier 1100, are configured to perform process blocks 1601-1602.

Figure 18:
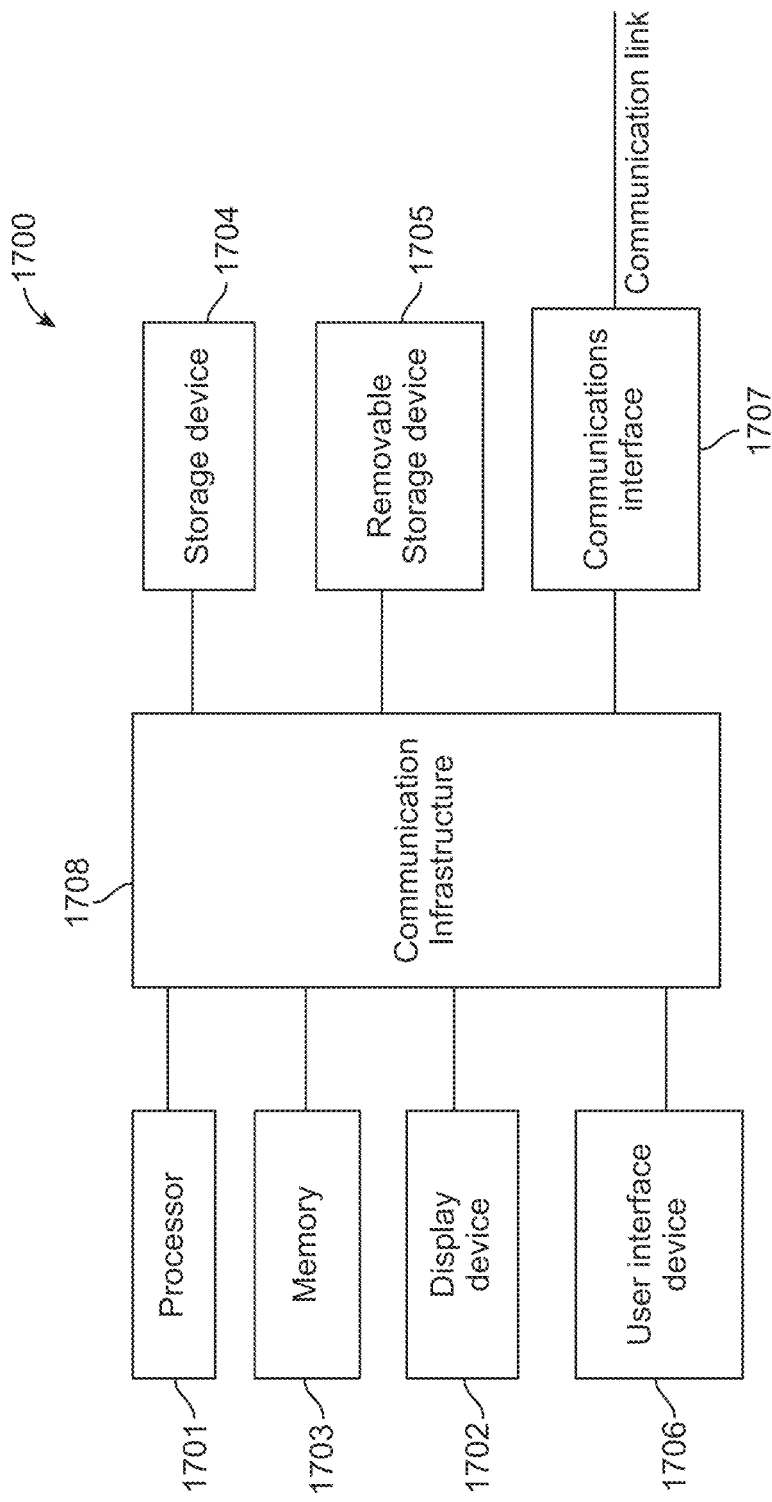
FIG. 18 is a high-level block diagram showing an information processing system comprising a computer system useful for implementing various disclosed embodiments.

FIG. 18 is a high-level block diagram showing an information processing system comprising a computer system 1700 useful for implementing various disclosed embodiments. The computer system 1700 includes one or more processors 1701, and can further include an electronic display device 1702 (for displaying video, graphics, text, and other data), a main memory 1703 (e.g., random access memory (RAM)), storage device 1704 (e.g., hard disk drive), removable storage device 1705 (e.g., removable storage drive, removable memory module, a magnetic tape drive, optical disk drive, computer readable medium having stored therein computer software and/or data), user interface device 1706 (e.g., keyboard, touch screen, keypad, pointing device), and a communication interface 1707 (e.g., modem, a network interface (such as an Ethernet card), a communications port, or a PCMCIA slot and card).

The communication interface 1707 allows software and data to be transferred between the computer system 1700 and external devices. The nonlinear controller 1700 further includes a communications infrastructure 1708 (e.g., a communications bus, cross-over bar, or network) to which the aforementioned devices/modules 1701 through 1707 are connected.

Information transferred via the communications interface 1707 may be in the form of signals such as electronic, electromagnetic, optical, or other signals capable of being received by communications interface 1707, via a communication link that carries signals and may be implemented using wire or cable, fiber optics, a phone line, a cellular phone link, a radio frequency (RF) link, and/or other communication channels. Computer program instructions representing the block diagrams and/or flowcharts herein may be loaded onto a computer, programmable data processing apparatus, or processing devices to cause a series of operations performed thereon to produce a computer implemented process. In one embodiment, processing instructions for process 1600 (FIG. 17) may be stored as program instructions on the memory 1703, storage device 1704, and/or the removable storage device 1705 for execution by the processor 1701.

Embodiments have been described with reference to flowchart illustrations and/or block diagrams of methods, apparatus (systems), and computer program products. In some cases, each block of such illustrations/diagrams, or combinations thereof, can be implemented by computer program instructions. The computer program instructions when provided to a processor produce a machine, such that the instructions, which executed via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatuses, or other devices to function in a particular manner, such that the instructions stored in the computer readable medium produce an article of manufacture including instructions which implement the function/act specified in the flowchart and/or block diagram block(s).

As will be appreciated by one skilled in the art, aspects of the embodiments may be embodied as a system, method or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In some cases, aspects of one or more embodiments are described above with reference to flowchart illustrations and/or block diagrams of methods, apparatuses (systems), and computer program products. In some instances, it will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block(s).

The computer program instructions may also be loaded onto a computer, other programmable data processing apparatuses, or other devices to cause a series of operational steps to be performed on the computer, other programmable apparatuses, or other devices to produce a computer implemented process such that the instructions which execute on the computer or other programmable apparatuses provide processes for implementing the functions/acts specified in the flowchart and/or block diagram block(s).

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of pre-AIA 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof; however, other versions are possible. Therefore, the spirit and scope of the appended claims should not be limited to the description of the preferred versions contained herein.

What is claimed is:

1. A system comprising:
   a single DC voltage source; and
   a class-D amplifier comprising at least one DC/DC converter operated by the single DC voltage source, wherein the class-D amplifier is configured to:
   receive an input signal for power amplification; and
   generate, via the at least one DC/DC converter, an output voltage level that exceeds a DC supply voltage from the single DC voltage source in at least one polarity;
   wherein a gain of the class-D amplifier is a ratio of the output voltage level to the input signal; and
   wherein a steady-state operating point of the at least one DC/DC converter is zero output.

2. The system of claim 1, wherein the input signal comprises an audio signal.

3. The system of claim 1, further comprising:
   a controller configured to implement feedback control for the class-D amplifier.

4. The system of claim 1, wherein each DC/DC converter comprises multiple switches.

5. The system of claim 1, wherein each DC/DC converter comprises multiple Metal Oxide Semiconductor Field Effect Transistors (MOSFETs).

6. The system of claim 1, wherein the class-D amplifier comprises only one DC/DC converter in a single-ended configuration, and the output voltage level exceeds the DC supply voltage in only a negative polarity.

7. The system of claim 1, wherein the class-D amplifier comprises two DC/DC converters arranged in the same topology, and the output voltage level exceeds the DC supply voltage in both a positive polarity and a negative polarity.

8. The system of claim 7, wherein the output voltage level is a differential output voltage measured across output terminals of the two DC/DC converters.

9. The system of claim 7, wherein a first DC/DC converter of the two DC/DC converters is driven complementary to a second DC/DC converter of the two DC/DC converters.

10. The system of claim 1, wherein each DC/DC converter is independently controlled and driven based on an individual duty ratio corresponding to the DC/DC converter.

11. The system of claim 10, further comprising:
    a class-D modulator configured to, for each DC/DC converter, limit an individual duty ratio corresponding to the DC/DC converter.

12. The system of claim 6, wherein the DC/DC converter is driven based on a duty ratio D, and a conversation ratio of the DC/DC converter is $(1-2D)/(1-D)$.

13. The system of claim 1, wherein the zero output of the steady-state operating point of the at least one DC/DC converter represents that the at least one DC/DC converter generates no output during a nominal operation condition.

14. A class-D amplifier device comprising:
at least one DC/DC converter operated by a single DC voltage source, wherein the at least one DC/DC converter is configured to:
receive an input signal for power amplification; and
generate an output voltage level that exceeds a DC supply voltage from the single DC voltage source in at least one polarity; and
a low-pass LC filter configured to make the output voltage level low noise;
wherein a gain of the class-D amplifier device is a ratio of the output voltage level to the input signal; and
wherein a steady-state operating point of the at least one DC/DC converter is zero output.

15. The class-D amplifier device of claim 14, wherein the input signal comprises an audio signal.

16. The class-D amplifier device of claim 14, wherein the class-D amplifier device comprises only one DC/DC converter in a single-ended configuration, and the output voltage level exceeds the DC supply voltage in only a negative polarity.

17. The class-D amplifier device of claim 14, wherein the class-D amplifier device comprises two DC/DC converters arranged in the same topology, and the output voltage level exceeds the DC supply voltage in both a positive polarity and a negative polarity.

18. The class-D amplifier device of claim 16, wherein the DC/DC converter is driven based on a duty ratio D, and a conversation ratio of the DC/DC converter is (1-2D)/(1-D).

19. The class-D amplifier device of claim 14, wherein the zero output of the steady-state operating point of the at least one DC/DC converter represents that the at least one DC/DC converter generates no output during a nominal operation condition.

20. A method comprising:
receiving an input signal for power amplification; and
generating, via at least one DC/DC converter operated by a single DC voltage source, a DC output voltage that exceeds a DC supply voltage from the single DC voltage source in at least one polarity;
wherein a gain of the power amplification is a ratio of the output voltage level to the input signal; and
wherein a steady-state operating point of the at least one DC/DC converter is zero output.

* * * * *